United States Patent
Iwata et al.

(10) Patent No.: US 7,981,213 B2
(45) Date of Patent: Jul. 19, 2011

(54) GROUP III NITRIDE CRYSTAL, CRYSTAL GROWTH PROCESS AND CRYSTAL GROWTH APPARATUS OF GROUP III NITRIDE

(75) Inventors: Hirokazu Iwata, Miyagi (JP); Seiji Sarayama, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 565 days.

(21) Appl. No.: 11/785,036

(22) Filed: Apr. 13, 2007

(65) Prior Publication Data

US 2007/0194408 A1 Aug. 23, 2007

Related U.S. Application Data

(62) Division of application No. 10/702,776, filed on Nov. 7, 2003, now Pat. No. 7,220,311.

(30) Foreign Application Priority Data

Nov. 8, 2002 (JP) ................................ 2002-325131
Nov. 26, 2002 (JP) ................................ 2002-342748

(51) Int. Cl.
*C30B 11/04* (2006.01)
(52) U.S. Cl. ............................. 117/68; 117/70; 117/71
(58) Field of Classification Search ............... 117/68, 117/70, 71, 73
See application file for complete search history.

(56) References Cited

U.S. PATENT DOCUMENTS

| | | | |
|---|---|---|---|
| 5,637,531 A * | 6/1997 | Porowski et al. | 117/89 |
| 5,665,985 A | 9/1997 | Iwata | |
| 5,684,523 A | 11/1997 | Satoh et al. | |
| 6,398,867 B1 * | 6/2002 | D'Evelyn et al. | 117/11 |
| 6,592,663 B1 | 7/2003 | Sarayama et al. | |
| 6,780,239 B2 | 8/2004 | Sarayama et al. | |
| 7,001,457 B2 | 2/2006 | Sarayama et al. | |
| 2002/0046695 A1 | 4/2002 | Sarayama et al. | |
| 2002/0175338 A1 | 11/2002 | Sarayama et al. | |
| 2003/0046695 A1 | 3/2003 | Billmaier et al. | |
| 2003/0164138 A1 | 9/2003 | Sarayama et al. | |

FOREIGN PATENT DOCUMENTS

| | | |
|---|---|---|
| JP | 2000-327495 | 11/2000 |
| JP | 2001-064097 | 3/2001 |
| JP | 2001-064098 | 3/2001 |
| JP | 2001-102316 | 4/2001 |
| JP | 2001-119103 | 4/2001 |
| JP | 2002-128586 | 5/2002 |
| JP | 2002-201100 | 7/2002 |
| JP | 2002-326898 | 11/2002 |

OTHER PUBLICATIONS

Hisanori Yamana et al.—"Preparation of GaN Single Crystals Using a Na Flux," Chem. Mater. 1997, 9, pp. 413-416.
Sylwester Porowski—"Bulk and homoepitaxial GaN-growth and characterization," Journal of Crystal Growth 189/190, 1998 Elsevier Science B.V., pp. 153-158.

* cited by examiner

*Primary Examiner* — Robert M Kunemund
(74) *Attorney, Agent, or Firm* — Dickstein Shapiro LLP

(57) ABSTRACT

A crystal growth method of a group III nitride includes the steps of forming a melt mixture of an alkali metal and a group III element in a reaction vessel, and growing a crystal of a group III nitride formed of the group III element and nitrogen from the melt mixture in the reaction vessel, wherein the step of growing the crystal of the group III nitride is conducted while controlling an increase rate of degree of supersaturation of a group III nitride component in the melt mixture in a surface region of the melt mixture.

1 Claim, 9 Drawing Sheets

GROUP III NITRIDE CRYSTAL, CRYSTAL GROWTH PROCESS AND CRYSTAL GROWTH APPARATUS OF GROUP III NITRIDE

CROSS-REFERENCE TO RELATED APPLICATIONS

This application is a divisional of U.S. patent application Ser. No. 10/702,776, filed on Nov. 7, 2003, now U.S. Pat. No. 7,220,311 the subject matter of which is incorporated in its entirety by reference herein.

BACKGROUND OF THE INVENTION

The present invention relates to a group III nitride crystal and crystal growth process and crystal growth apparatus of a group III nitride.

At present, the device of InGaAlN system (group III nitride) used for purple, blue or green optical source is mostly produced by a crystal growth process such as MO-CVD process (metal-organic chemical vapor deposition process), MBE process (the molecular beam epitaxy process), and the like, conducted on a sapphire or SiC substrate. In the case sapphire or SiC is used as the substrate, however, there arises problems such as increased crystal defects caused by the difference of thermal expansion coefficient or lattice constant with regard to the group III nitride. Thus, there have been various difficulties in a light-emitting device that uses such a group III nitride crystal such as poor device characteristics, difficulty in increasing the lifetime, large operational power, and the like.

In the case of using a sapphire substrate, which is an insulation substrate, it is impossible to take out the electrode through the substrate as is practiced in conventional light-emitting devices, and it becomes necessary to take out the electrode from the surface side of the nitride semiconductor formed by a crystal growth process. As a result, there arise problems such as increased device area and increased cost. Also, chip separation by cleaving has been difficult in a group III nitride semiconductor device produced on a sapphire substrate, and it has been difficult to form the cavity edge surface needed in a the laser diode (LD) by conducting a cleavage process. Because of this, it is practiced presently to form the cavity edge surface by conducting a dry etching process. Alternatively, the cavity edge surface is formed in the process somewhat similar to a cleavage process after polishing the sapphire substrate to the thickness of 100 μm or less. In this case, too, it is impossible conduct the formation of cavity edge surface and the separation of the chips process simultaneously as is practiced in a conventional LD, and problems such as complexity of the process and increased cost are not avoidable.

In order to solve these problems, there is a proposal to reduce the crystal defect by conducting selective lateral growth or other process of the group III nitride semiconductor film on a sapphire substrate. According to this method, it has become possible to reduce the crystal defects as compared with the case in which such a selective lateral growth of the GaN film is not conducted on the sapphire substrate. However, the problem of insulating nature and difficulty of cleavage process mentioned before caused by the sapphire substrate is still remaining. Further, there arise problems which lead to cost increase such as complication of the process and warp of the substrate caused by as a result of using different materials in the case of using a sapphire substrate together with a GaN thin film.

In order to solve such a problem, the use of a bulk GaN substrate, which is the same material grown on the substrate, is deemed most appropriate. Therefore, investigations are being made on the crystal growth of bulk GaN by using a gas phase growth process or a liquid phase growth process. However, there has been no report about high quality GaN substrate successfully formed to have a practical size.

For example there is a proposal in Conventional Technology 1 to grow a bulk crystal of GaN and use the bulk crystal of GaN thus grown as the substrate for homoepitaxial growth. According to this proposal, the GaN bulk crystal is grown from a Ga melt in a nitrogen ambient of ultra high pressure such as several ten kilobars at the high temperature of 1400-1700° C.

In this case, it becomes possible to grow group III nitride semiconductor films needed for a device by using the GaN bulk substrate formed by a bulk growth process. Thus, it becomes possible to realize a GaN substrate without complicating the process. However, there is a problem in such an approach that crystal growth under high temperature and high pressure is necessary while the reaction vessel enduring such a high pressure and high temperature process condition is extremely expensive. Also, there is a problem in that the crystals grown with this method form a plate-like crystal having a C principal surface of about 1 cm diameter, while the thickness thereof is only 20-30 μm at the maximum, and the crystal easily undergoes cracking or breaking during the device production process.

As an alternative method of realizing a GaN substrate, there is proposed in Conventional Technology 2 a growth process of a GaN crystal that uses Na as a flux. In this method, sodium azide ($NaN_3$) and metallic Ga are confined in a reaction vessel of stainless steel (inner diameter=7.5 mm, length=100 mm) together with a nitrogen gas as the source materials, wherein the GaN crystal is grown by holding the reaction vessel at the temperature of 600-800° C. for 24-100 hours.

In the case of Conventional Technology 2, the crystal growth is possible at a comparatively low temperature of 600-800° C. Further, a comparatively low pressure of 100 $kg/cm^2$ or less is used inside the vessel. Thus, this technology enables crystal growth under more practical growth condition. However, there is a problem in this method that the size of the crystal obtained is very small, not reaching 1 mm.

So far, the inventors of the present invention have made inventions shown in Conventional Technology 3, Conventional Technology 4, Conventional Technology 5, and Conventional Technology 6.

Here, it should be noted that Conventional Technology 3 discloses the technology of supplying a group V source material stably. Also, Conventional Technology 4 discloses the method of conducting crystal growth by using a seed crystal. Further, Conventional Technology 5 discloses growth of a group III nitride crystal by supplying group III source material to from a compound of a group III element and an alkali metal. Further, Conventional Technology 6 discloses growth of a group III nitride crystal of cubic crystal system.

In such crystal growth processes, it should be noted that the growth of the group III nitride crystal is caused by supplying a substance containing nitrogen to a melt mixture containing the group III element and alkali metal from outside of the reaction vessel.

Below, the invention of Conventional Technology 3 will be explained with reference to the drawings. FIG. 2 is a diagram showing an example of the construction of the crystal growth apparatus of Conventional Technology 3. Referring to FIG. 2, a melt mixture 102 of a group III element (Ga (gallium) for example) and a flux (metallic Na or a compound containing Na (sodium azide, and the like)) is accommodated into the reaction vessel 101. Further, heating device 105 capable of controlling the temperature to the temperature in which crystal growth becomes possible is provided to the reaction vessel 101.

Further, a seed crystal 103 (GaN crystal for example) is provided so as to make a contact with the gas-liquid interface 113 defining the boundary of the gas and the melt 102 inside the reaction vessel 101.

It should be noted that a nitrogen gas is used for the nitrogen source material. In order to supply the nitrogen gas into the reaction vessel 101, there is provided a first gas supply device 120 outside the reaction vessel 101, wherein the first gas supply device 120 is formed of a first cylinder 110 for storing the gaseous nitrogen source material and a first valve 111, and the nitrogen gas is supplied to reaction vessel 101 from the first cylinder 110 of the first gas supply device 120 filled with the nitrogen gas and located outside of the reaction vessel 101 by way of the nitrogen supply line 106.

In order to adjust the nitrogen pressure, there is provided a pressure adjustment system in the midway of the nitrogen supply line 106, wherein the pressure adjustment system of the nitrogen gas is formed of a pressure sensor 107 and a pressure adjustment valve 108 and the pressure information measured with pressure sensor 107 is transmitted to the pressure adjustment valve 108 through a cable 109. With this, the pressure adjustment is achieved by the pressure adjustment valve 108. It should be noted that the nitrogen pressure inside the reaction vessel 101 can be set to a desired value.

It should be noted that the nitrogen gas pressure inside the first cylinder 110 filled with the nitrogen gas set to be equal to or larger than the pressure inside the reaction vessel 101 at the time the group III nitride the crystal (GaN for example) is grown.

Thus, the nitrogen gas used as the nitrogen source material is supplied from the first cylinder 110 to the reaction vessel 101 after the gas pressure being adjusted with the pressure adjustment system.

By using the crystal growth apparatus of such a construction, there is caused growth of the group III nitride crystal (GaN crystal for example) under the condition, such as growth temperature, nitrogen pressure, Na quantity, and the like, set so as to enable crystal growth starting from the seed crystal 103, and the size of the group III nitride crystal is increased with time while using the melt 102, in which there are contained the alkali metal (Na for example), the group III element (Ga (gallium) for example) and the nitrogen gas supplied from outside as the source material.

Thus, in the invention of Conventional Technology 3, the nitrogen gas is supplied from the outside as a nitrogen source material in the state in which there is sufficient group III element and alkali metal (Na for example), and with this, a continual growth of the group III nitride crystal (GaN crystal) becomes possible, and it becomes possible to grow the group III nitride crystal (GaN crystal) to a desired size.

Similarly, a continual growth of the group III nitride crystal (GaN crystal) is carried out also in the inventions of Conventional Technology 4, Conventional Technology 5 and Conventional Technology 6, by supplying the nitrogen source material from the outside of the reaction vessel.

However, in any of these inventions in Conventional technologies 3, 4, 5 and 6, there have been a tendency in which a polycrystalline aggregate of group III nitride covers the melt mixture surface. When this takes place, the source material is depleted due to the consumption of the group III element in the melt mixture for the formation of the polycrystalline aggregate, and the desired large crystal is not obtained. Thus, there has been a problem in that it not possible to grow a crystal of desired size in the vicinity of the melt mixture surface.

Conventional Technology 1: Journal of Crystal Growth, vol. 189/190, 153-158 (1998).
Conventional Technology 2: Chemistry of Materials, vol. 19, 413-416, (1997).
Conventional Technology 3: Japanese Laid Open Patent Application 2001-64097.
Conventional Technology 4: Japanese Laid Open Patent Application 2001-64098.
Conventional Technology 5: Japanese Laid Open Patent Application 2001-102316.
Conventional Technology 6: Japanese Laid Open Patent Application 2001-119103.

SUMMARY OF THE INVENTION

Accordingly, it is a general object of the present invention to provide a novel and useful crystal growth process and a crystal growth apparatus of a group III nitride wherein the foregoing problems are eliminated.

Another and more specific object of the present invention is to provide a crystal growth process and a crystal growth apparatus of a group III nitride capable of suppressing formation of the polycrystalline aggregate covering the melt mixture surface and thus capable of performing stabile crystal growth of the group III nitride.

Another object of the present invention is to provide a high quality and large single crystal of group III nitride.

Another object of the present invention is to provide a crystal growth method of a group III nitride, comprising the steps of:

forming a melt mixture of an alkali metal and a group III element in a reaction vessel; and growing a crystal of a group III nitride formed of said group III element and nitrogen from said melt mixture in said reaction vessel, said step of growing said crystal of said group III nitride being conducted while controlling an increase rate of degree of supersaturation for a group III nitride component in said melt mixture in a surface region of said melt mixture.

According to the present invention, the problem of formation of the polycrystalline aggregate at the melt surface is successfully suppressed due to the fact that nucleation in the vicinity of the melt mixture surface is suppressed as a result of control of the increase rate of supersaturation. Thereby, the problem occurred conventionally that the source material of the group III element is depleted in the melt mixture due to the extensive formation of polycrystalline aggregate is eliminated and the problem that the crystal of desired quality and size cannot be grown in the vicinity of the melt surface is also eliminated. As a result, it becomes possible to conduct the crystal growth of the group III nitride readily and reliably.

In a preferred embodiment of the present invention, said control of change rate of the degree of supersaturation of said group III nitride is conducted by controlling the rate of increase of nitrogen concentration in the vicinity of the surface of the melt mixture.

By controlling the supply rate of the nitrogen source material as such, it becomes possible to control the increase rate of the degree of supersaturation at the melt mixture surface easily.

In another preferred embodiment of the present invention, a substance containing nitrogen is introduced into the reaction vessel in the form of a gas, and nitrogen thus introduced with the gas is supplied into the melt mixture across the surface thereof for the crystal growth of the group III nitride. Thereby, the control of the increase rate of the nitrogen concentration in the vicinity of the surface of the melt mixture is achieved by controlling the pressure of the substance containing nitrogen.

According to the present embodiment, the increase rate of the nitrogen concentration at the melt mixture surface can be controlled by controlling the pressure of the substance containing nitrogen. Thereby, it becomes possible to suppress the sharp increase in the degree of supersaturation, and the problem of uncontrolled nucleation is eliminated. With this, it becomes possible to suppress the formation of the polycrystalline aggregate that covers the melt mixture surface.

In another preferred embodiment of the present invention, the substance containing nitrogen is introduced into the reaction vessel after the temperature of the melt mixture has reached a specified crystal growth temperature, and the pressure of the substance containing nitrogen is increased afterwards with a controlled rate.

With this embodiment, it becomes possible to suppress the sharp increase in the degree of supersaturation caused by sharp increase of the nitrogen concentration at the surface of the melt mixture at the time of introducing the substance containing nitrogen. It should be noted that the increase rate of the pressure can be controlled easily by using a pressure control unit, and the like. Because of this, it becomes possible to control the degree of supersaturation of the melt mixture surface easily.

In a further preferred embodiment of the present invention, the crystal growth of said group III nitride is conducted by holding the pressure of the substance containing nitrogen constant at the moment the group III nitride starts to crystallize.

According to the present embodiment, there occurs no increase of pressure of the substance containing nitrogen at the temperature in which the crystal growth takes place. As a result, there occurs no sharp increase in the degree of supersaturation at the melt surface, and the problem of uncontrolled nucleation in the vicinity of the melt mixture surface is effectively suppressed. As a result, the problem of formation of the polycrystalline aggregate at the melt mixture surface is successfully eliminated.

Another object of the invention is to provide a crystal growth apparatus for crystallizing a group III nitride of a group III element and nitrogen from a melt mixture of an alkali metal and a substance containing a group III element and a substance containing nitrogen, comprising:

a reaction vessel holding therein said melt mixture; and a pressure control system maintaining a pressure of said substance containing nitrogen constant.

According to the present invention, it becomes possible to increase the temperature of the melt mixture to a crystal growth temperature without increasing the pressure of the substance containing nitrogen. Thus, by using the crystal growth apparatus of the present invention for the crystal growth of the group III nitride, the problem of formation of polycrystalline aggregate covering the melt mixture surface is eliminated and the problem of the group III element in the melt mixture being consumed by the formation of the polycrystalline aggregate is eliminated. Thereby, the problem that the crystal of the desired size has not been obtained is also eliminated. Further, the problem that the desired crystal growth has been not possible in the vicinity of the melt surface is also eliminated, and it becomes possible to conduct stable crystal growth of the group III nitride.

In a preferred embodiment of the present invention, a gas of a substance containing nitrogen is introduced into the reaction vessel at a temperature in which crystal growth of the group III nitride is caused, such that the temperature of the melt mixture in the vicinity of the melt mixture surface is controlled at the time of introducing the gas.

According to the present embodiment, the control of the temperature is carried out easily and precisely, and the degree of supersaturation of the melt mixture surface is controlled easily.

In a preferred embodiment, the gas is introduced into the reaction vessel with a controlled rate.

According to the present embodiment, the sharp increase in the degree of supersaturation of the melt mixture in the vicinity of the melt mixture surface caused of the melt mixture at the gas-liquid interface by the introduction of the gas and associated falling off of the temperature is successfully controlled, and uncontrolled nucleation at the melt mixture surface is eliminated. It should be noted that the introduction rate of the gas is easily controlled by using a pressure regulator, and the like.

In another embodiment of the present invention, the gas of the substance containing nitrogen is supplied to the reaction vessel with controlled temperature.

According to the present embodiment, the problem of temperature drop of the melt mixture at the gas-liquid interface with the introduction of the gas is successfully eliminated, and the problem of sharp increase in the degree of supersaturation of the melt mixture in the vicinity of the melt mixture surface is eliminated. Thereby, occurrence of uncontrolled nucleation at the melt mixture surface is also eliminated.

In a preferred embodiment of the present invention, the group III nitride is grown from a seed crystal.

According to the present embodiment noted above, it becomes possible to grow a high quality crystal from the seed crystal while avoiding the problem of growth of polycrystal on the seed crystal or the seed crystal being covered with the polycrystalline aggregate.

In a preferred embodiment of the present invention, the group III nitride crystal is grown in the vicinity of said melt mixture surface.

According to the present embodiment, the melt mixture surface is no longer covered with the polycrystalline aggregate and the problem of depletion of the group III element in the melt is eliminated. Thus, it becomes possible to conduct a stable crystal growth of the group III nitride in the vicinity of the melt surface. Because of the high nitrogen concentration in the vicinity of the melt surface, it becomes possible to grow a crystal having a reduced nitrogen defect by growing the crystal in the vicinity of the melt mixture surface. Further, because of the increased nitrogen concentration, a large growth rate is achieved and a large group III nitride crystal is obtained in short time.

Another object of the present invention is to provide a crystal growth method of a group III nitride, comprising the steps of:

forming a melt mixture of an alkali metal and a group III element in a reaction vessel; and growing a crystal of a group III nitride formed of said group III element and nitrogen from said melt mixture in said reaction vessel, said step of growing said crystal of said group III nitride being conducted while controlling a ratio of said alkali metal and said group III element in said melt mixture.

According to the present invention, the problem of formation of polycrystalline aggregate covering the melt mixture surface is eliminated by crystallizing the melt mixture while controlling the ratio of the alkali metal and the group III element in the melt mixture in the reaction vessel. Thereby, the problem occurred conventionally that the source material of the group III element is depleted in the melt mixture due to the extensive formation of polycrystalline aggregate is eliminated. Further, the problem that the crystal of desired quality and size cannot be grown in the vicinity of the melt surface is eliminated. As a result, it becomes possible to conduct the crystal growth of the group III nitride reliably.

Another object of the present invention is to provide a crystal growth apparatus for crystallizing a group III nitride of a group III element and nitrogen from a melt mixture of an alkali metal and a substance containing said group III element and a substance containing nitrogen, comprising:

a reaction vessel holding therein said melt mixture; and a structure for supplying a heated gas into said reaction vessel.

According to the present embodiment, the temperature drop of the melt mixture in the vicinity of the gas-liquid interface caused by introduction of the gas is eliminated by providing a structure for supplying a heated gas into the reaction vessel, and the problem of sharp increase in the degree of supersaturation in the vicinity of the melt mixture is suppressed. Thereby, the problem of uncontrolled nucleation at the melt mixture surface is also eliminated.

Further, according to the present invention, it becomes possible to grow a plate-like crystal of the group III nitride with a thickness exceeding 20 μm, such as 80-100 μm. The group III nitride thus obtained is characterized by low dislocation density of less than $10^6$ cm$^{-2}$.

Further, according to the present invention, it becomes possible to grow a columnar crystal of the group III nitride extending in a c-axis direction with a length exceeding 5 mm and a lateral size exceeding 3 mm. The columnar group III nitride thus obtained is characterized by low dislocation density of less than $10^6$ cm$^{-2}$.

Further, according to the present invention, it becomes possible to construct a high performance and high reliability device such as a light-emitting device or an electron device including a laser diode on a single crystal substrate of the group III nitride formed by such a columnar crystal.

Another object of the present invention is to provide a crystal growth method of a group III nitride formed of a group III element and nitrogen, comprising the steps of:

forming a melt mixture in a reaction vessel from an alkali metal and a substance containing said group III element; and growing a crystal of said group III nitride in said reaction vessel from said melt mixture and a substance containing at least nitrogen, said step of growing said crystal being conducted by increasing a pressure of said substance containing nitrogen with increase of temperature of said melt mixture in said reaction vessel.

According to the present invention, the pressure of nitrogen inside the reaction vessel increases with temperature rise of the melt mixture, and the nitrogen concentration in the melt mixture is increased accordingly. Thereby, the problem of formation of the polycrystalline aggregate covering the melt mixture surface is successfully suppressed by suppressing simultaneous formation of numerous crystal nuclei in the vicinity of the melt mixture surface leasing to the formation of the polycrystalline aggregate. Because of this, the group III element in the melt mixture is no longer consumed by the formation of the polycrystalline aggregate, and the problem of depletion of the source material is eliminated. As a result, it becomes possible to conduct growth of a large crystal of group III nitride stably and with reliability.

In a preferred embodiment of the present invention, said pressure of said substance containing nitrogen is increased by introducing said substance containing nitrogen into said reaction vessel from outside of said reaction vessel in accordance with increase of said temperature of said melt mixture. By controlling pressure, it becomes possible to control the process condition easily by controlling the pressure increase, which can be conveniently achieved by using a suitable high-precision pressure control unit. Thereby, the pressure can be controlled in accordance with the temperature with high precision. As a result, the problem of formation of numerous crystal nuclei is suppressed and hence the formation of the polycrystalline aggregate covering the melt mixture surface.

In another preferred embodiment of the present invention, said pressure of said substance containing nitrogen is increased by introducing said substance containing nitrogen and further an inert gas into said reaction vessel from outside of said reaction vessel in accordance with increase of said temperature of said melt mixture.

According to the present embodiment, it becomes possible to suppress the formation of the polycrystalline aggregate also in the case an inert gas is introduced into the reaction vessel for suppressing evaporation of the alkali metal characterized by high vapor pressure. Thereby, it becomes possible to conduct the crystal growth of the group III nitride stably and with reliability while suppressing the evaporation of the alkali metal.

In another preferred embodiment of the present invention, said step of growing said crystal of said group III nitride comprises the steps of sealing said reaction vessel after introducing said substance containing nitrogen into said reaction vessel and increasing said temperature of said melt mixture to a predetermined crystal growth temperature.

According to the present embodiment, the pressure of the substance containing nitrogen is increased together with increase of the temperature of the melt mixture, and the pressure control can be achieved easily solely by the temperature control, without using a pressure control unit.

In a further preferred embodiment of the present invention, said step of sealing said reaction vessel is conducted when said substance containing nitrogen is introduced into said reaction vessel with such an amount that a partial pressure of said substance containing nitrogen reaches a predetermined partial pressure when said temperature of said melt mixture has reached said predetermined crystal growth temperature.

According to the present embodiment, it is possible to avoid the problem that the pressure of the substance containing nitrogen exceeds a predetermined pressure at the crystal growth temperature. Thereby, it becomes possible to omit the mechanism in the crystal growth apparatus to vent the pressure, and the cost for the crystal growth apparatus can be reduced. Further, the present embodiment can eliminate the need of pressure control once the temperature increase has been started. Thus, the chance that the growth condition is disturbed by external cause as in the case of sudden decrease of the nitrogen concentration in the melt mixture caused by a sudden pressure drop is eliminated, and it becomes possible to conduct the crystal growth under a predetermined growth condition.

In a further preferred embodiment of the present invention, said step of growing said crystal comprises the steps of sealing said reaction vessel after introducing said substance containing nitrogen and an inert gas into said reaction vessel and increasing said temperature of said melt mixture to said predetermined crystal growth temperature.

According to the present embodiment, it becomes possible to suppress formation of the polycrystalline aggregate also in the case an inert gas is introduced for suppressing the evaporation of the alkali metal having a high vapor pressure. Further, according to the present invention, it is possible to control the pressure solely by the control of the temperature, without using a pressure control unit.

In a further preferred embodiment of the present invention, said step of sealing said reaction vessel is conducted when said substance containing nitrogen and said inert gas are introduced into said reaction vessel with such an amount that a partial pressure of said substance containing nitrogen and a partial pressure of said inert gas reach respective predetermined pressure values when said temperature of said melt mixture has reached said predetermined crystal growth temperature.

According to the present embodiment, the pressure of the substance containing nitrogen does not exceed the predetermined pressure at the crystal growth temperature. Thus, there is no need of providing a mechanism of pressure vent, and the cost of the crystal growth apparatus is reduced. Further, the need of controlling the pressure is eliminated once the temperature increase has been started, and the chance of the growth condition being disturbed by external cause such as drop of the nitrogen concentration in the melt mixture induced by pressure change is eliminated. Thereby, a stable crystal growth becomes possible.

In a further preferred embodiment of the present invention, said step of growing said crystal is conducted such that said crystal forms a plate-like crystal.

According to the present embodiment, it becomes possible to growth the group III nitride crystal stably in the form of a plate-like crystal By using the plate-like crystal of the group III nitride thus formed, it becomes possible to provide a large diameter bulk crystal substrate of the group III nitride, and it becomes possible to construct various high performance and high reliability semiconductor devices.

In a further preferred embodiment of the present invention, said step of growing said crystal is conducted such that said crystal forms a columnar crystal.

By using such a columnar crystal, it becomes possible to provide a large number of bulk crystal substrates of the group III nitride by slicing such a columnar single crystal. Thereby, it becomes possible to construct various high performance and high reliability devices on such a group III nitride bulk crystal.

In a further preferred embodiment of the present invention, said step of growing said crystal is conducted by using a seed crystal.

According to the present embodiment noted above, it becomes possible to grow a high quality crystal from the seed crystal while avoiding the problem of growth of polycrystal on the seed crystal or the seed crystal being covered with the polycrystalline aggregate.

In a further preferred embodiment of the present invention, said group III nitride crystal is formed in the vicinity of a surface of said melt mixture.

According to the present embodiment, the melt mixture surface is no longer covered with the polycrystalline aggregate and the problem of depletion of the group III element in the melt is eliminated. Thus, it becomes possible to conduct a stable crystal growth of the group III nitride in the vicinity of the melt surface. Because of the high nitrogen concentration in the vicinity of the melt surface, it becomes possible to grow a crystal having a reduced nitrogen defect by growing the crystal in the vicinity of the melt mixture surface. Further, because of the increased nitrogen concentration, a large growth rate is achieved and a large group III nitride crystal is obtained in short time.

Other objects and further features of the present invention will become apparent from the following detailed description when read in conjunction with the attached drawings.

DETAILED DESCRIPTION OF THE PREFERRED EMBODIMENT

Figure 1:
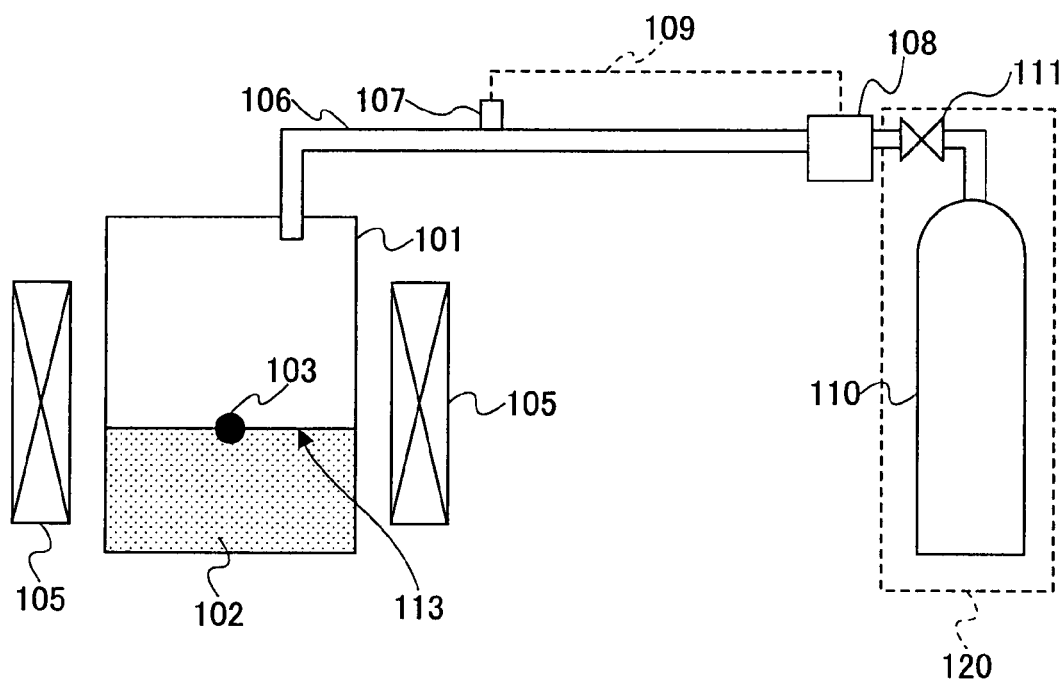
FIG. 1 is a diagram (cross-sectional view) showing an example of a conventional crystal growth apparatus.

Hereinafter, the present invention will be described for various embodiments with reference to the drawings.

During the investigation of crystal growth of GaN single crystal from a melt mixture, the inventor of the present invention came to a perception, which lead to a first aspect of the present invention, that the occurrence of the polycrystalline aggregate at the surface of the melt mixture, from which the crystallization of the group III nitride takes place, in the conventional technology may be caused by uncontrolled nucleation occurring at the melt mixture surface, which in turn may be caused by sharp increase of the degree of supersaturation of the group III nitride component in the melt mixture at the surface part thereof. Thus, in the first aspect of the present invention, the inventor conducted investigations for suppressing the increase of the degree of supersaturation in the melt from which the crystallization of the group III nitride occurs and containing the group III element and nitrogen.

First Embodiment

The first embodiment of the present invention provides a crystal growth method of a group III nitride, comprising the steps of: forming a melt mixture of an alkali metal and a group III element in a reaction vessel; and growing a crystal of a group III nitride formed of said group III element and nitrogen from said melt mixture in said reaction vessel, said step of growing said crystal of said group III nitride being conducted while controlling an increase rate of degree of supersaturation of a group III nitride component in said melt mixture in a surface region in the vicinity of a surface of said melt mixture.

In the present invention, the term "super saturation" is used for the group III nitride in the meaning that the group III element and nitrogen are dissolved into the melt mixture with a concentration exceeding the concentration in which the group III element and nitrogen cause precipitation of the group III nitride. Further, "degree of supersaturation" means the degree or extent of the supersaturation. Thus, the degree of supersaturation increases with increasing concentration of the group III element and nitrogen beyond the solubility limit beyond which there is caused precipitation of the group III element and nitrogen in the form of group III nitride.

When there is caused nucleation or formation of crystal nuclei, this means that there is caused a supersaturation state for the group III element and nitrogen dissolved in the melt mixture. Here, a large number of crystal nuclei are formed simultaneously when the degree of supersaturation is increased sharply. When those crystal nuclei grow and gather together, there is formed a crystalline aggregate. The increase rate of the degree of supersaturation has not been considered in the conventional technologies 3, 4, 5 and 6 mentioned before, and it is believed that this is the reason why a large number of crystal nuclei are formed simultaneously at the melt mixture surface in the process of the conventional technology, leading to the formation of the polycrystalline aggregate at the melt mixture surface.

Thus, in the present invention, simultaneous formation of the crystal nuclei at the melt mixture surface is suppressed by controlling the increase rate of the degree of supersaturation at the melt mixture surface such that there is caused no simultaneous formation of large number of crystal nuclei at the surface of the melt mixture.

In the present invention, it should be noted that the group III nitride means a nitride compound of a group III element selected from one or more of gallium, aluminum and indium.

Further, it should be noted that the substance that includes nitrogen means the compound containing nitrogen as a constituting element such as nitrogen gas, sodium azide, and the like.

For the alkali metal, Na (sodium) and K (potassium) are generally used, while it is also possible to use other alkali metal.

Further, it is possible to dissolve other element into the melt containing the alkali metal. For example, it is possible to dissolve the n-type impurity element or p-type impurity element for the purpose of doping.

Thus, in, the crystal growth process of the present invention, crystal growth is conducted by controlling the increase rate of the degree of supersaturation of the melt mixture in the vicinity of the surface thereof. Thereby, nitrogen dissolved into the melt mixture starts to cause bonding with the group III element in the presence of the alkali metal at a specified crystal growth temperature. Thereby, stable crystal growth of the group III nitride is obtained without forming the polycrystalline aggregate.

It should be noted that the control method of the increase rate of the degree of supersaturation in the melt mixture surface is not limited to a particular process. The increase of the degree of supersaturation occurs in the case nitrogen is dissolved into the melt mixture or and in the case the saturation concentration falls off due to the temperature decrease of the melt mixture. Thus, it becomes possible to control the increase rate of the degree of supersaturation of the group III nitride by controlling the rate of introduction of the nitrogen source material or the temperature of the melt mixture.

Second Embodiment

A second embodiment of the present invention provides a crystal growth method as set forth in the first embodiment, wherein said control of said change rate of degree of supersaturation of said group III nitride component is conducted by controlling a rate of increase of nitrogen concentration in said melt mixture in said surface region of the said melt mixture.

In the case the nitrogen source material is dissolved into the melt mixture, the nitrogen concentration in the vicinity of the surface may increase sharply when the supply rate of the nitrogen source material is excessive, and there occurs sharp increase in the degree of supersaturation. thereby, a large number of crystal nuclei are formed simultaneously. As a result of growth and gathering together of such crystal nuclei, there is formed the polycrystalline aggregate. In conventional technologies 3, 4, 5 and 6 noted before, especially, there has been no consideration about the supply rate of the nitrogen source material, and because of this, there are cases in which the crystal aggregate is formed as a result of simultaneous formation of a large number of crystal nuclei at the melt mixture surface such that the crystal aggregate covers the melt mixture surface. In the second embodiment of the present invention, on the other hand, the increase rate of the nitrogen concentration in the vicinity of the surface of the melt mixture is controlled to a rate sufficiently small such that there occurs no simultaneous formation of numerous crystal nuclei. With this, the sharp increase of the degree of supersaturation at the melt mixture surface is controlled and simultaneous formation of large amount of crystal nuclei at the melt mixture surface is suppressed.

Thus, in the case of conducting crystal growth by controlling the increase rate of the nitrogen concentration in the vicinity of the melt mixture surface as noted above, there occurs bonding of nitrogen dissolved into the melt mixture with the group III element in the presence of the alkali metal at a specified crystal growth temperature. Thus, there is caused no formation of the crystal aggregate and it becomes possible to cause crystal growth of the group III nitride with reliability.

It should be noted that the control method of the increase rate of the nitrogen concentration in the melt mixture surface is not limited to a particular method. For example, it is possible to control the increase rate of the nitrogen concentration in the melt mixture surface by controlling the supply rate of the nitrogen source material. In the case in which the nitrogen source material is a gas, it is possible to control the increase rate of the nitrogen concentration at the melt mixture surface by controlling the pressure.

Third Embodiment

A third embodiment of the present invention provides a method as set forth in the second embodiment, wherein said step of growing said crystal of said group III nitride comprises the step of introducing a substance containing nitrogen into said reaction vessel in the form of a gas, said step of controlling the degree of supersaturation being conducted by conducting a step of controlling an increase rate of nitrogen concentration in said melt mixture in said surface region of said melt mixture, said step of controlling said increase rate of nitrogen concentration in said melt mixture being conducted by controlling a pressure of said substance containing nitrogen.

Thus, the amount of nitrogen dissolving into the melt mixture is increased when the pressure of the nitrogen source gas (substance containing nitrogen) in equilibrium with the melt mixture is increased, and the nitrogen concentration in the vicinity of the melt mixture surface is increased. Thereby, the crystal nuclei are formed. When there is caused sharp increase in the pressure of the nitrogen source gas in this state, there is caused sharp increase in the degree of supersaturation, and a large number of crystal nuclei are formed simultaneously. Thereby, the polycrystalline aggregate is formed as a result of growth of these crystal nuclei and gathering together of the crystals thus grown. In the third embodiment of the present invention, on the other hand, the occurrence of simultaneous formation of numerous crystal nuclei is eliminated by controlling the pressure of the substance containing nitrogen, and formation of the crystal aggregate is successfully suppressed. Thereby, crystal growth of the group III nitride can be conducted successfully.

Fourth Embodiment

A fourth embodiment of the present invention provides a crystal growth method as set forth in the third embodiment, wherein said substance containing nitrogen is introduced into said reaction vessel after a temperature of said melt mixture has reached a specified crystal growth temperature for causing crystal growth of said group III nitride, such that the pressure of said substance containing nitrogen is increased with a controlled rate during a growth of said group III nitride.

In the conventional technologies 3, 4, 5 and 6, there has been no particular consideration with regard to the pressure increase rate of the nitrogen source gas, and because of this, numerous crystal nuclei have been formed in the melt mixture surface simultaneously, leading to formation of crystal aggregate covering the melt mixture surface. In the fourth embodiment of the present invention, on the other hand, the pressure of the substance containing nitrogen is increased gradually (slowly) so that the nitrogen concentration, in other words the degree of supersaturation of the group III nitride component at the melt mixture surface do not increase sharply the pressure of the substance containing nitrogen is increased to a predetermined pressure for conducting the crystal growth. In other words, the increase of the pressure of the substance containing nitrogen is conducted slowly such that there is caused no simultaneous formation of numerous crystal nuclei. With this, it becomes possible to eliminate the formation of the crystal nuclei, and the formation of the polycrystalline aggregate is suppressed during the crystal growth of the group III nitride.

For the method of increasing the pressure of the substance containing nitrogen, various methods can be used, such as increasing the pressure by supplying the nitrogen source material from the outside of the reaction vessel with pressurization, increasing the pressure by decreasing the capacity inside the reaction vessel, and the like. Any of these can be used. Further, the present invention is not limited to such particular process.

Table below (Table 1) shows the result of investigation with regard to the relationship between the pressure increase rate and appearance of the polycrystalline aggregate for the case GaN is grown under the nitrogen pressure of 4 MPa at the growth temperature of 775° C.

TABLE 1

| | Nitrogen Pressure increase rate (MPa/min) | | | | | |
|---|---|---|---|---|---|---|
| | 0.05 | 0.1 | 0.2 | 0.3 | 0.4 | 0.5 |
| Existence of polycrystalline aggregate | ○ | ○ | Δ | Δ | Δ | x |

In Table 1, ○ represents the case where formation of the polycrystalline aggregate was not observed, Δ represents the case in which existence of small polycrystalline aggregate was observed at the bottom of the melt mixture, while x represents the case in which the polycrystalline aggregate has covered the melt mixture surface.

From Table 1, it can be seen that the melt mixture surface is covered with the crystal aggregate in the case the pressure increase rate of the nitrogen is set to 0.5 MPa/min. From this it is concluded that the pressure increase rate of nitrogen is preferably slower than 0.5 MPa/min, more preferably slower than 0.2 MPa/min.

Fifth Embodiment

A fifth embodiment of the present invention provides a crystal growth method as set forth in third embodiment, wherein said pressure of said substance containing nitrogen is held constant at the moment said group III nitride starts to crystallize.

In this fifth embodiment, the substance containing nitrogen is introduced into the reaction vessel at the temperature lower than the temperature in which the group III nitride grows, and the crystal growth is started by increasing the temperature to a predetermined crystal growth temperature while holding the pressure constant. Thereby, the pressure may be held constantly by discharges the gas to the outside of the reaction vessel by the opening or closing of the valve that divides and reaction vessel and the outside. Alternatively, there is a method of providing a tank accumulating the gas of the substance containing nitrogen outside of the reaction vessel in connection therewith such that the pressure fluctuation inside the reaction vessel is absorbed and the pressure fluctuation is eliminated. However, the present invention is not limited to these particular method and other methods may also be employed.

In this fifth embodiment, the pressure of the substance containing nitrogen is held constant at the time the crystal growth is started. By conducting the crystal growth of the group III nitride in this state, there no longer occurs sharp increase of the nitrogen concentration in the vicinity of the melt mixture surface. Thus, sharp increase of the degree of supersaturation at the melt mixture surface is suppressed and the simultaneous formation of the crystal nuclei at the melt mixture surface is successfully suppressed.

Sixth Embodiment

A sixth embodiment of the present invention provides a crystal growth apparatus for crystallizing a group III nitride formed of a group III element and nitrogen from a melt mixture of an alkali metal and a substance containing a group III element and a substance containing nitrogen, comprising: a reaction vessel holding therein said melt mixture; and a pressure control system keeping a pressure of said substance containing nitrogen constant.

Here, it should be noted that the mechanism for maintaining the pressure of the substance containing nitrogen is not limited the one discharging the gas to the outside by opening or closing of the valve or the one suppressing the pressure fluctuation of the gas by providing a tank accumulating the gas outside the reaction vessel. Any other suitable mechanism can be used in the present invention.

Seventh Embodiment

A seventh embodiment of the present invention provides a method as set forth in first embodiment, wherein said step of growing said crystal of said group III nitride comprises the step of introducing a gas of a substance containing nitrogen into said reaction vessel at a temperature in which crystal growth of said group III nitride is caused, said step of introducing said gas being conducted such that a temperature of said melt mixture in said surface region is controlled at the time when said gas is introduced.

When the temperature of the melt mixture falls off, the solubility of the group III nitride in the melt mixture in which nitrogen is dissolved falls off together, and there occurs increase in the degree of supersaturation. Thereby, there occurs the crystal nuclei formation. When the decrease of temperature of the melt mixture surface is caused too fast, the degree of supersaturation increases sharply and the polycrystalline aggregate is formed inevitably as a result of simultaneous formation of numerous crystal nuclei and as a result of aggregation of the crystal nuclei after causing crystal growth.

In the conventional technologies 3, 4, 5 and 6, there has been no particular consideration has been made with regarding to the temperature decrease at the melt mixture surface associated with the gas introduction. Because of this, there have been cases in which numerous crystal nuclei are formed simultaneously at the melt mixture surface and the crystal aggregate is formed so as to cover the melt mixture surface.

In the seventh embodiment, the decrease of temperature of the surface of the melt mixture associated with the introduction of the gas is controlled, and because of this, sharp increase of the degree of supersaturation is successfully eliminated, and simultaneous formation of numerous crystal nuclei is suppressed also successfully. Thereby, formation of the crystal aggregate eliminated, and nitrogen dissolved into the melt mixture causes bonding with the group III element in the presence of the alkali metal at a predetermined growth temperature. Thus, it becomes possible to grow the group III nitride crystal.

It should be noted that the method of controlling the temperature of the surface of the melt mixture is not limited to a specific process. For example, it is possible to suppress the temperature decrease rate by controlling the gas supply rate. Alternatively, the gas introduced into the reaction vessel may be heated in advance.

Eighth Embodiment

An eighth embodiment of the present invention provides a method as set forth in seventh embodiment, wherein said gas is introduced into said reaction vessel with a controlled rate.

When the temperature of the melt mixture dissolving nitrogen is decreased, the solubility of the group III nitride in the melt mixture falls off accordingly, and because of this, there is caused increase in the degree of supersaturation. As a result, numerous crystal nuclei are formed simultaneously. When the supply rate of the gas is too fast at the time of introducing the gas of the temperature lower than the temperature of the melt mixture, the temperature of the melt mixture surface falls off sharply, and because of this, the degree of supersaturation increases sharply. As a result, numerous crystal nuclei are formed simultaneously, and there is caused formation of the polycrystalline aggregate as a result of the growth and aggregation of the crystal nuclei thus formed.

In the conventional technologies 3, 4, 5, 6, no particular consideration is made to the temperature decrease of the melt mixture surface associated with the introduction of the gas, and because of this, there can be cases in which the polycrystalline aggregate is formed covering the melt mixture surface as a result of simultaneous formation of the numerous crystal nuclei at the melt mixture surface.

In the eighth embodiment, on the other hand, the supply rate of the gas is adjusted such that the degree of supersaturation of the melt mixture surface does not change sharply due to the rapid temperature decrease of the melt mixture surface. As a result, simultaneous formation of numerous crystal nuclei is suppressed.

Thus, in the eighth embodiment, the gas is introduced with a slow supply rate such that there occurs no rapid cooling of the melt mixture surface and such that the degree of supersaturation of the melt mixture surface does not change sharply. With this, nitrogen dissolved into the melt mixture causes bonding with the group III element in the presence of the alkali metal at a predetermined crystal growth temperature. Thereby, it becomes possible to grow the group III nitride crystal without forming the crystal aggregate is formed is nonexistent.

For the gas introduced into the reaction vessel, it is possible to use a nitrogen source gas or an inert gas used for pressurizing the reaction vessel for suppressing the evaporation of the alkali metal.

Ninth Embodiment

A ninth embodiment of the present invention provides a crystal growth method as set forth in the seventh embodiment, wherein said gas is introduced into said reaction vessel with a controlled temperature.

In the conventional technologies 3, 4, 5, 6, no particular consideration was made with regard to the temperature decrease of the melt mixture surface caused by introduction of the gas, and because of this, a gas having a temperature near the room temperature has been introduced. Thus, there occurred simultaneous formation of numerous crystal nuclei in the melt mixture surface, and the polycrystalline aggregate has been formed so as to cover the melt mixture surface.

In the crystal growth process of the ninth embodiment, the temperature of the melt mixture surface is adjusted at the time of introducing a gas into the reaction vessel for crystal growth such that the temperature of the melt mixture surface does not drop sharply and the degree of supersaturation of the melt mixture surface does not change sharply (by heating the gas beforehand for example). With this, simultaneous formation of numerous crystal nuclei make is eliminated.

By adjusting the temperature of the gas in this way (by heating the gas beforehand for example), the problem of formation of the polycrystalline aggregate as a result of nitrogen dissolved into to the melt mixture causing bonding with the group III element in the presence of the alkali metal at a specified crystal growth temperature is eliminated. Growth that crystallizes the group III nitride is produced.

Tenth Embodiment

A tenth embodiment of the present invention provides a crystal growth apparatus for crystallizing a group III nitride formed of a group III element and nitrogen from a melt mixture of an alkali metal and a substance containing a group III element and a substance containing nitrogen, comprising: a reaction vessel holding therein said melt mixture; and a structure for supplying a heated gas into said reaction vessel.

The mechanism used for supplying the heated gas it is not limited to a particular mechanism. For example, it is possible to use a mechanism in which a container heated by a heater is connected the reaction vessel by a line and by increasing the temperature of the gas introduced into the reaction vessel by causing to flow the gas into such a container.

Eleventh Embodiment

An eleventh embodiment of the present invention provides a crystal growth method of a group III nitride, comprising the steps of: forming a melt mixture of an alkali metal and a group III element in a reaction vessel; and growing a crystal of a group III nitride formed of said group III element and nitrogen from said melt mixture in said reaction vessel, said step of growing said crystal of said group III nitride being conducted while controlling a ratio of said alkali metal and said group III element in said melt mixture.

The inventor of the present invention has discovered experimentally that formation of the polycrystalline aggregate at the melt mixture surface is eliminated by changing the ratio of the alkali metal inside the melt mixture. This ratio changes with the crystal growth temperature and nitrogen pressure and should be selected properly from the growth condition.

Thus, by adjusting the mol ratio of the alkali metal in the melt mixture, the problem of formation of polycrystalline aggregate as a result of nitrogen diffused into the melt mixture causing bonding with the group III element in the presence of the alkali metal at a specified crystal growth temperature is eliminated, and it becomes possible to cause growth of the group III nitride.

The next table (Table 2) shows the relationship between the ratio Na/(Na+Ga) of Na (alkali metal) in the Ga—Na melt mixture and appearance of the polycrystalline aggregate for the case GaN is grown at the growth temperature of 775° C. under the nitrogen pressure of 5 MPa.

TABLE 2

| | Na/(Na + Ga) | | | |
|---|---|---|---|---|
| | 0.51 | 0.56 | 0.62 | 0.67 |
| Crystalline aggregate | ○ | Δ | Δ | x |

In Table 2, ○ shows the case formation of the polycrystalline aggregate was not observed, Δ shows the case small crystal aggregate was observed at the bottom of the melt mixture, x shows the case the polycrystalline aggregate has covered the melt mixture surface.

From Table 2, it can be seen that the melt mixture surface is covered with the polycrystalline aggregate in the case the ratio Na/(Na+Ga) of Na (alkali metal) is 0.67. Thus, in the case of growing the GaN crystal with the growth temperature of 775° C. and the nitrogen pressure of 5 MPa, it is concluded that the ratio Na/(Na+Ga) of Na (alkali metal) should be set smaller than 0.67, preferably smaller than 0.56.

Twelfth Embodiment

A twelfth embodiment of the present invention provides growth of a plate-like crystal of the group III nitride by using the crystal growth method of any of the first through fifth or seventh through ninth or eleventh embodiments of the present invention.

Thirteenth Embodiment

A thirteenth embodiment of the present invention provides growth of a columnar crystal of the group III nitride by using the crystal growth method of any of the first through fifth, seventh through ninth and eleventh embodiments of the present invention.

Fourteenth Embodiment

A fourteenth embodiment of the present invention provides growth of the group III nitride from a seed crystal in any of the twelfth or thirteenth embodiment of the present invention.

Fifteenth Embodiment

A fifteenth embodiment of the present invention provides growth of the group III nitride crystal in the vicinity of the melt mixture surface in any of the twelfth through fourteenth embodiments of the present invention.

Sixteenth Embodiment

A sixteenth embodiment of the present invention provides a plate-like GaN single crystal grown by the crystal growth method of any of the twelfth, thirteenth or fifteenth embodiment of the present invention.

The plate-like GaN crystal thus obtained has a hexagonal shape at the principal surface. The surface orientation of the principal surface, the length of the diagonal line, the thickness, and the dislocation density (measured by TEM), and the color of the GaN crystal thus obtained are summarized in the next table (Table 3).

TABLE 3

| Surface orientation | Diagonal length | Thickness | Dislocation density | Color |
|---|---|---|---|---|
| C surface | ≧3 mm | ≧80 μm | ≦$10^6$ cm$^{-2}$ | colorless |

Seventeenth Embodiment

A seventeenth embodiment of the present invention provides a columnar GaN single crystal grown according to the crystal growth method of any of the thirteenth through fifteenth embodiments of the present invention.

The columnar GaN crystal thus obtained has the length in the C direction, the width, the dislocation density (measured by TEM), and the color summarized in the next table (Table 4).

TABLE 4

| C axis length | Width | Dislocation density | color |
|---|---|---|---|
| ≧5 mm | ≧1 mm | ≦$10^6$ cm$^{-2}$ | colorless |

Example 1

In Example 1, a plate-like GaN single crystal of the sixteenth embodiment is grown in the vicinity of the melt mixture surface by using the crystal growth method in any of the first through fourth, twelfth and fifteenth embodiments.

Figure 2:
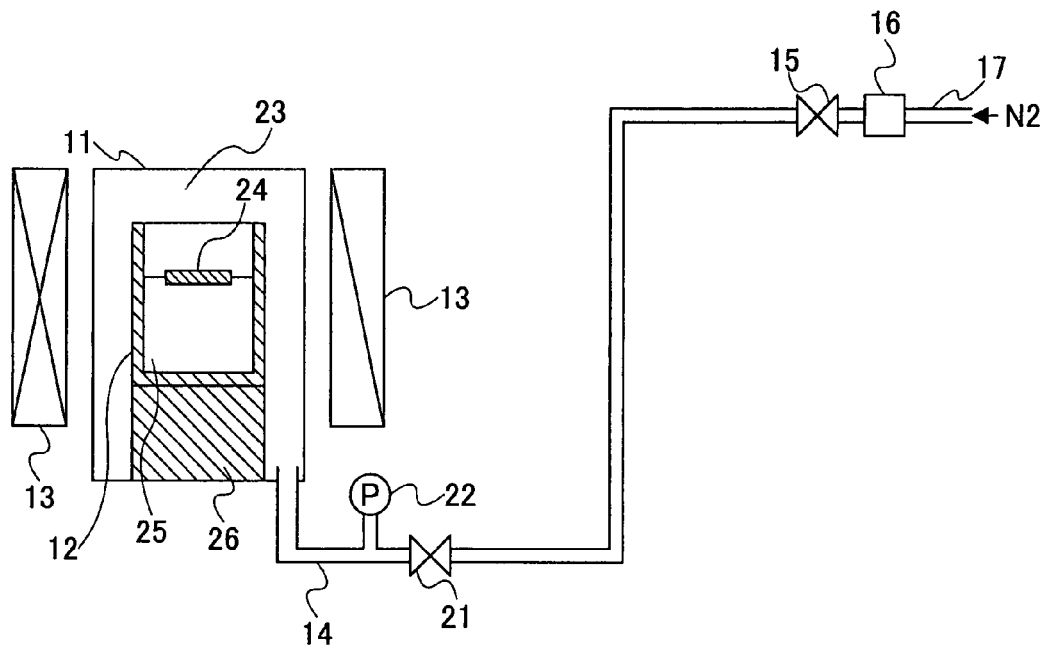
FIG. 2 is a diagram (cross-sectional view) showing an example of the crystal growth apparatus according to Example 1 of the present invention.

FIG. 2 is a diagram (cross-sectional view) showing an example of construction of the crystal growth apparatus of Example 1.

In the crystal growth apparatus of FIG. 2, a melt hold container 12 holds a melt mixture 25 containing therein the alkali metal and group III element is provided in a closed reaction vessel 11 of stainless steel for causing the crystal growth.

This melt hold container 12 is formed of BN and can be removed from the reaction vessel 11.

Further, a gas supply line 14 is provided through the reaction vessel 11 for filling an internal space 23 of the reaction vessel 11 with a nitrogen gas ($N_2$) used for the nitrogen source material. Thereby, the pressure of the nitrogen gas ($N_2$) inside the reaction vessel 11 can be controlled by a pressure control unit 16. Further, a pressure gauge 22 is provided so as to monitor the total pressure inside the reaction vessel 11.

Further, a heater 13 is provided outside of the reaction vessel 11, wherein the heater 13 can be controlled to a desired temperature.

It should be noted that the reaction vessel 11 can be removed from the crystal growth apparatus at the part of a valve 21, and thus, it is possible to work on the part of the reaction vessel 11 in a glove box.

Next, the growth method of GaN that uses this crystal growth apparatus will be explained.

First, the reaction vessel 11 is separated from the crystal growth apparatus at the part of the valve 21 and accommodated into a glove box of Ar atmosphere.

Next, Ga is introduced into the crucible 12 made of BN as the group III element source material, and sodium (Na) is further introduced as the alkali metal. The ratio of Na and Ga is set to 2:1. This means that Na/(Na+Ga) is set to 0.67.

Next, the crucible 12 is introduced into the reaction vessel 11. Further, the reaction vessel 11 is sealed and the valve 21 is closed such that the interior of the reaction vessel 11 is disconnected from the outside atmosphere.

Because the foregoing series of processes are conducted in the glove box of high purity Ar gas atmosphere, the interior of the reaction vessel 11 is also filled with the Ar gas.

Next, reaction vessel 11 is taken out from the glove box and assembled to the crystal growth apparatus. Thus, the reaction vessel 11 is provided to a specified position where the heater 13 is provided and is connected to the nitrogen gas supply line 14 at the part of the valve 21.

Next, the heater 13 is energized with electric current and the temperature of the melt mixture 25 of Ga and Na held in crucible 12 is increased to the crystal growth temperature. The crystal growth temperature was set to 775° C.

Next, the valves 15 and 21 are opened and the nitrogen gas is introduced into the reaction vessel 11. At this time, the nitrogen pressure is increased with an increase rate of 0.05 MPa/min by means of the pressure control unit 16, until the total pressure inside the reaction vessel 11 reaches 4 MPa. After holding this state for 300 hours, the temperature is reduced to the room temperature.

Similarly, crystal growth were made for the duration of 300 hours at the total pressure inside the reaction vessel 11 set to 4 MPa while increasing the nitrogen pressure with various increase rates of 0.1, 0.2, 0.3, 0.4 and 0.5 MPa/min.

The next table (Table 5) summarizes appearance of the polycrystalline aggregate for the case the increase rate of the nitrogen pressure is changed variously during the crystal growth process.

TABLE 5

| | Nitrogen pressure increase rate (MPa/min) | | | | | |
|---|---|---|---|---|---|---|
| | 0.05 | 0.1 | 0.2 | 0.3 | 0.4 | 0.5 |
| Polycrystalline aggregate | ○ | ○ | Δ | Δ | Δ | x |

In Table 5, ○ represents the case formation of the polycrystalline aggregate was not observed, Δ represents the case in which small polycrystalline aggregate was formed at the bottom of the melt mixture, while x represents the case in which the polycrystalline aggregate has covered the melt mixture surface.

In the case the increase rate of the nitrogen pressure is set to 0.05 MPa/min or 0.1 MPa/min during the crystal growth process, it can be seen from Table 5 that there is caused no formation of the polycrystalline aggregate covering the melt surface in the container 12. In this case, it was observed that a colorless transparent GaN single crystal 24 was formed on the melt surface with a hexagonal plate-like shape, wherein the GaN single crystal thus formed had a principal surface of C surface and a diagonal length of 5 mm.

In the case the crystal growth was made with the increase rate of the nitrogen pressure of 0.2 MPa/min, 0.3 MPa/min or 0.4 MPa/min, the small crystal aggregate was formed at the bottom of the melt mixture container. However, there occurred no formation of polycrystalline aggregate covering the melt surface, and there was formed a colorless transparent GaN single crystal 24 on the melt surface in the form of a hexagonal plate, wherein the GaN single crystal thus formed had the principal surface of C surface and a diagonal line length of about 3-4 mm.

In the case the crystal growth was made with the increase rate of the nitrogen pressure of 0.5 MPa/min, on the other hand, there was caused extensive formation of the polycrystalline aggregate covering the melt surface, and formation of a single crystal GaN of plate-like form was not observed at the melt surface.

The plate-like GaN crystals thus grown with the foregoing conditions were examined by a scanning electron microscope with regard to the section parallel to C axis, and it was confirmed that the thickness of the GaN single crystal thus obtained exceeds 80 μm. Further, it was confirmed also by the observation by the transmission electron microscope that the dislocation density in the GaN single crystal is less than $10^6$ cm$^{-2}$.

Example 2

In Example 2, a GaN single crystal was formed by the crystal growth process of any of the first through fourth, seventh and eighth, and twelfth and fifteenth embodiments.

Figure 3:
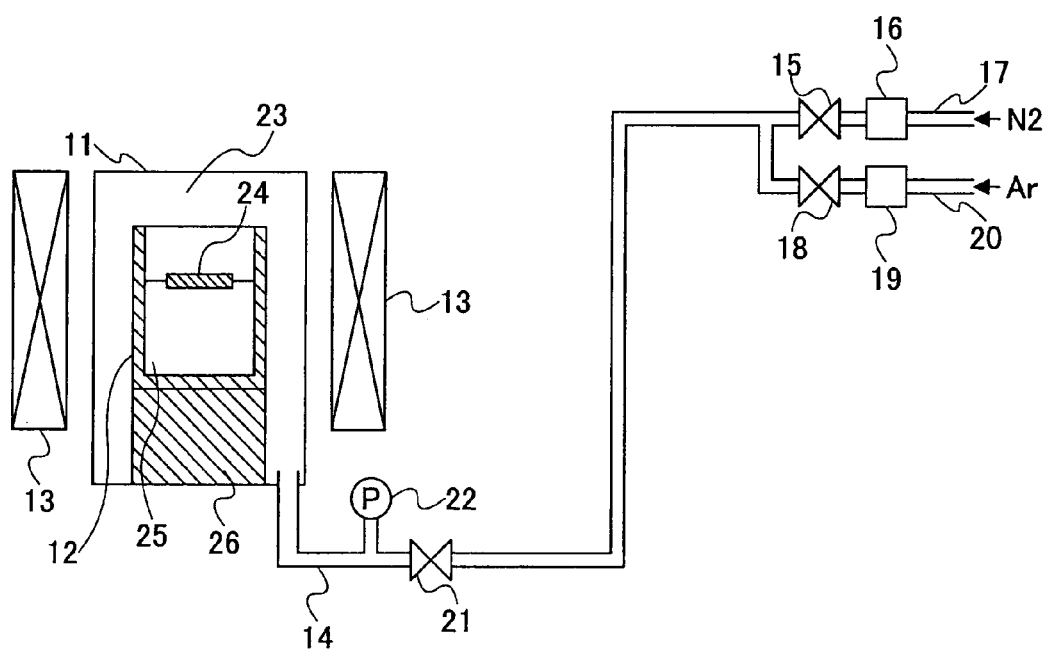
FIG. 3 is a diagram (cross-sectional view) showing an example of the crystal growth apparatus according to Example 2 of the present invention.

FIG. 3 is a diagram (cross-sectional view) showing an example of construction of the crystal growth apparatus of Example 2. The crystal growth apparatus of FIG. 3 is the one in which an Ar gas supply line is added to the apparatus of FIG. 2.

Thus, in the apparatus of FIG. 3, the crucible 12 for holding the melt mixture 25 containing the alkali metal and the group III element is provided inside the reaction vessel 11 of stainless having a closed form.

This crucible 12 is formed of BN and can be removed from the reaction vessel 11.

Further, the gas supply line 14 is provided through the reaction vessel 11 for filling the interior 23 of the reaction vessel 11 with nitrogen ($N_2$) used for the nitrogen source material and further with an argon (Ar) gas for suppressing evaporation of the alkali metal, and further for enabling control of the nitrogen ($N_2$) gas pressure and the argon (Ar) gas pressure inside the reaction vessel 11. Further, the gas supply line 14 is branched into a nitrogen supply line 17 and an argon supply line 20 separable form each other by the valve 15 and a valve 18. Further, the respective pressures can be adjusted with the pressure control unit 16 and also with a pressure control unit 19. Further, the pressure gauge 22 monitors the total pressure inside the reaction vessel 11.

By mixing argon as the inert gas, it becomes possible to control the pressure of the nitrogen gas independently while suppressing the evaporation of the alkali metal. With this, crystal growth becomes possible with excellent controllability.

Further, the heater 13 is provided outside of the reaction vessel 11, wherein the heater 13 can be controlled to a desired temperature.

It should be noted that the reaction vessel 11 can be removed from the crystal growth apparatus at the part of a valve 21, and thus, it is possible to work on the part of the reaction vessel 11 in a glove box.

Next, the growth method of GaN that uses this crystal growth apparatus will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further introduced as the alkali metal. The ratio of Na and Ga is set to 2:1. This means that Na/(Na+Ga) is set to 0.67.

Next, the crucible 12 is introduced into the reaction vessel 11. Further, the reaction vessel 11 is sealed and the valve 21 is closed such that the interior of the reaction vessel 11 is disconnected from the outside atmosphere.

Because the foregoing series of processes are conducted in the glove box of high purity Ar gas atmosphere, the interior of the reaction vessel 11 is also filled with the Ar gas.

Next, reaction vessel 11 is taken out from the glove box and assembled to the crystal growth apparatus. Thus, the reaction vessel 11 is provided to a specified position where the heater 13 is provided and is connected to the nitrogen and argon gas supply line 14 at the part of the valve 21.

Next, the heater 13 is energized with electric current and the temperature of the melt mixture 25 of Ga and Na held in crucible 12 is increased to the crystal growth temperature. The crystal growth temperature was set to 775° C.

Next, the valves 15 and 21 are opened and the nitrogen gas is introduced into the reaction vessel 11. At this time, the nitrogen pressure is increased with an increase rate of 0.1 MPa/min by means of the pressure control unit 16, until the total pressure inside the reaction vessel 11 reaches 4 MPa. Thus, the nitrogen partial pressure in the interior 23 of the reaction vessel 11 is set to about 4 MPa.

Next, the valve 15 is closed and the valve 18 is opened subsequently, the Ar gas is introduced into the reaction vessel 11 from the Ar gas supply line 20. Thereby, the pressure control unit 19 is used to control the Ar pressure such that the Ar pressure is increased with the rate of 0.1 MPa/min, until the total pressure inside reaction vessel 11 reaches 8 MPa.

After holding this state for 300 hours, the temperature is reduced to the room temperature and the pressure of the gas inside the reaction vessel 11 is lowered. When the reaction vessel 11 is opened, it was observed that there occurred no formation of the polycrystalline aggregate in the crucible 12 covering the melt surface. Instead, it was observed that there was formed a single crystal 24 of GaN of colorless transparent plate-like form having a lateral size of about 5 mm at the melt surface. In this experiment, the amount of evaporation of sodium was smaller than in the case Ar is not introduced.

Example 3

In Example 3, a GaN single crystal was formed by the crystal growth process of any of the first through fourth, seventh and ninth, and twelfth and fifteenth embodiments by using the crystal growth apparatus of the tenth embodiment.

Figure 4:
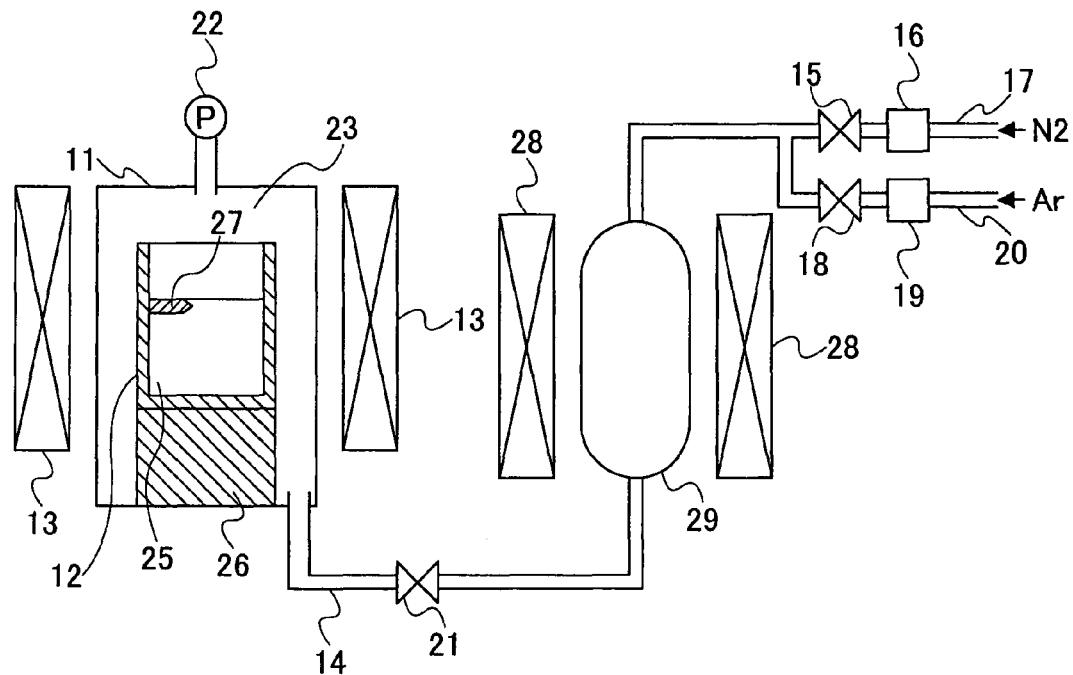
FIG. 4 is a diagram (cross-sectional view) showing an example of the crystal growth apparatus according to Example 3 of the present invention.

FIG. 4 is a diagram (cross-sectional view) showing an example of construction of the crystal growth apparatus of Example 3. The crystal growth apparatus of FIG. 4 is the one in which a preheating mechanism of gas is added to the apparatus of FIG. 3.

Thus, in the apparatus of FIG. 4, the crucible 12 for holding the melt mixture 25 containing the alkali metal and the group III element is provided inside the reaction vessel 11 of stainless having a closed form.

This crucible 12 is formed of BN and can be removed from the reaction vessel 11.

Further, the gas supply line 14 is provided through the reaction vessel 11 for filling the interior 23 of the reaction vessel 11 with nitrogen ($N_2$) used for the nitrogen source material and further with an argon (Ar) gas for suppressing evaporation of the alkali metal, and further for enabling control of the nitrogen ($N_2$) gas pressure and the argon (Ar) gas pressure inside the reaction vessel 11. Further, there is provided a heating container 29 in the midway of the gas supply line 14 for pre-heating the gas, wherein the heating container 29 is heated with the heater 28 and conducts preheating of the gas introduced into the reaction vessel 11.

Further, the gas supply line 14 is branched into a nitrogen supply line 17 and an argon supply line 20 separable form each other by the valve 15 and a valve 18. Further, the respective pressures can be adjusted with the pressure control unit 16 and also with a pressure control unit 19. Further, the pressure gauge 22 monitors the total pressure inside the reaction vessel 11.

By mixing argon as the inert gas, it becomes possible to control the pressure of the nitrogen gas independently while suppressing the evaporation of the alkali metal. With this, crystal growth becomes possible with excellent controllability.

Further, the heater 13 is provided outside of the reaction vessel 11, wherein the heater 13 can be controlled to a desired temperature.

It should be noted that the reaction vessel 11 can be removed from the crystal growth apparatus at the part of a valve 21, and thus, it is possible to work on the part of the reaction vessel 11 in a glove box.

Next, the growth method of GaN that uses this crystal growth apparatus will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 2:1. This means that Na/(Na+Ga) is set to 0.67.

Next, the crucible 12 is introduced into the reaction vessel 11. Further, the reaction vessel 11 is sealed and the valve 21 is closed such that the interior of the reaction vessel 11 is disconnected from the outside atmosphere.

Because the foregoing series of processes are conducted in the glove box of high purity Ar gas atmosphere, the interior of the reaction vessel 11 is also filled with the Ar gas.

Next, reaction vessel 11 is taken out from the glove box and assembled to the crystal growth apparatus. Thus, the reaction vessel 11 is provided to a specified position where the heater 13 is provided and is connected to the nitrogen and argon gas supply line 14 at the part of the valve 21.

Next, the heater 13 is energized with electric current and the temperature of the melt mixture 25 of Ga and Na held in crucible 12 is increased to the crystal growth temperature. The crystal growth temperature was set to 775° C.

Next, the valves 15 and 21 are opened and the nitrogen gas is introduced into the reaction vessel 11. At this time, the nitrogen pressure is increased with an increase rate of 0.1 MPa/min by means of the pressure control unit 16, until the total pressure inside the reaction vessel 11 reaches 4 MPa. Thus, the nitrogen partial pressure in the interior 23 of the reaction vessel 11 is set to about 4 MPa.

Next, the valve 15 is closed and the valve 18 is opened subsequently, the Ar gas is introduced into the reaction vessel 11 from the Ar gas supply line 20. Thereby, the pressure control unit 19 is used to control the total pressure of the reaction vessel 11 to 8 MPa.

Here, it should be noted that the pre-heating container 29 is heated to 775° C., and the Ar gas or nitrogen gas is pre-heated as it passes through the pre-heating container 29 before introduced into the reaction vessel 11.

After holding this state for 300 hours, the temperature is reduced to the room temperature and the pressure of the gas inside the reaction vessel 11 is lowered. When the reaction vessel 11 is opened, it was observed that there occurred no formation of the polycrystalline aggregate in the crucible 12 covering the melt surface. Instead, it was observed that there was formed a single crystal 27 of GaN of colorless transparent plate-like form having a length of about 6 mm at inner wall in the vicinity of the melt surface.

Example 4

In Example 4, the columnar GaN single crystal of the seventeenth embodiment was formed by using the crystal growth process of the eleventh or thirteenth embodiment.

Figure 5:
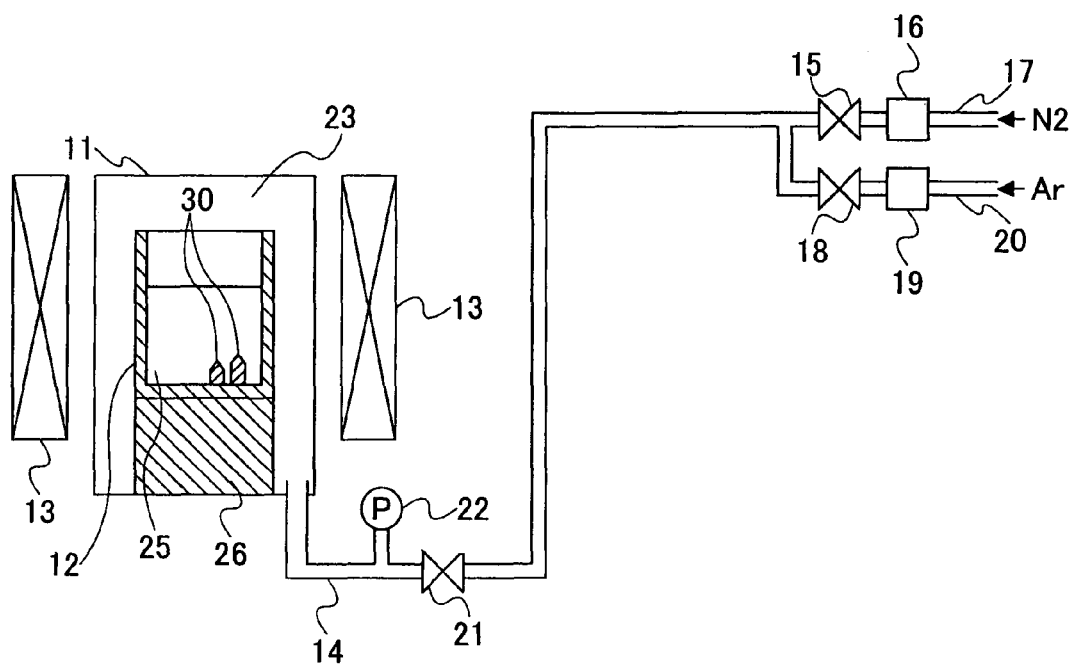
FIG. 5 is a diagram (cross-sectional view) showing the example of the crystal growth apparatus according to Example 4 of the present invention.

FIG. 5 a diagram (cross-sectional view) showing an example of the construction of the crystal growth apparatus of Example 4, wherein it should be noted that the crystal growth apparatus of FIG. 5 is the same device as that of FIG. 3.

Next, the growth method of GaN that uses this crystal growth apparatus will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further introduced as the alkali metal. The ratio of Na and Ga is set to 0.51 in terms of the ratio Na/(Na+Ga).

Next, the crucible 12 is introduced into the reaction vessel 11. Further, the reaction vessel 11 is sealed and the valve 21 is closed such that the interior of the reaction vessel 11 is disconnected from the outside atmosphere.

Because the foregoing series of processes are conducted in the glove box of high purity Ar gas atmosphere, the interior of the reaction vessel 11 is also filled with the Ar gas.

Next, the reaction vessel 11 is taken out from the glove box and assembled into the crystal growth apparatus.

Thus, the reaction vessel 11 is provided to a specified position where the heater 13 is provided and is connected to the gas supply line 14 of the nitrogen and argon at the part of the valve 21.

Next, the heater 13 is energized with electric current and the temperature of the melt mixture 25 of Ga and Na held in crucible 12 is increased to the crystal growth temperature. The crystal growth temperature was set to 775° C.

Next, the valves 21 and 18 are opened and the nitrogen gas is introduced into the reaction vessel 11. At this time, the nitrogen pressure is controlled to 4 MPa by using the pressure control unit 19.

Next, the valve 18 is closed and the valve 15 is opened subsequently, and the nitrogen gas is introduced into the reaction vessel 11. Thereby, the pressure control unit 16 is used to control the pressure to 8 MPa. Thus, the nitrogen partial pressure in the reaction vessel 11 becomes 4 MPa.

In this Example 4, the supply rate (pressure increase rate) of the Ar gas and the nitrogen gas is not controlling. After holding this state for 300 hours, the temperature is reduced to the room temperature.

After lowering the pressure inside the reaction vessel 11, the reaction vessel 11 was opened. It was observed that there is no formation of poly crystalline aggregate covering the melt surface. Further, it was observed that colorless transparent single crystals 30 of GaN of columnar shape were formed at the bottom of the crucible 12 with a length of 6 mm long in the C axis direction.

Further, a similar crystal growth was conducted for the duration of 300 hours for various ratios of Na and Ga by using the Na/(Na+Ga) ratio of 0.56, 0.62 and 0.67.

The results of this experiment are summarized in Table 2 noted before.

As explained with reference to Table 2, there is caused no formation of the polycrystalline aggregate in the crucible 12 covering the melt surface in the case the growth is made by setting the Na ratio Na/(Na+Ga) to 0.51. In this case, it was observed that colorless transparent single crystals of GaN having a hexagonal columnar shape were grown at the bottom of the crucible 12 with a length of about 6 mm in the direction of C axis.

In the case the crystal growth was made by setting the ratio Na/(Na+Ga) of Na in the melt mixture to 0.56 and 0.62, it was also confirmed that there is formed no polycrystalline aggregate covering the melt surface, although there were small crystal aggregate at the bottom of crucible 12, and it was further observed that colorless transparent single crystals 30 of GaN of hexagonal columnar form were grown at the bottom of the crucible 12 with a length of about 5 mm in the direction of C axis.

In the case the crystal growth was made by setting the Na ratio Na/(Na+Ga) in the melt mixture to 0.67, there occurs extensive formation of the crystal aggregate covering the melt surface, and the GaN single crystals obtained had the size of 2 mm or less.

As a result of the scanning microscopic observation made for the C surface of the columnar GaN crystal grown with the conditions noted above, it was observed that crystals having a size of 1 mm or more in the diagonal direction are grown. Further, the dislocation density obtained by observation of the transmission electron microscope was $10^6$ cm$^{-2}$ or less.

Example 5

In Example 5, a columnar GaN single crystal was formed by using the crystal growth process of any of first through fourth, eleventh, and thirteenth through fifteenth embodiments.

Figure 6:
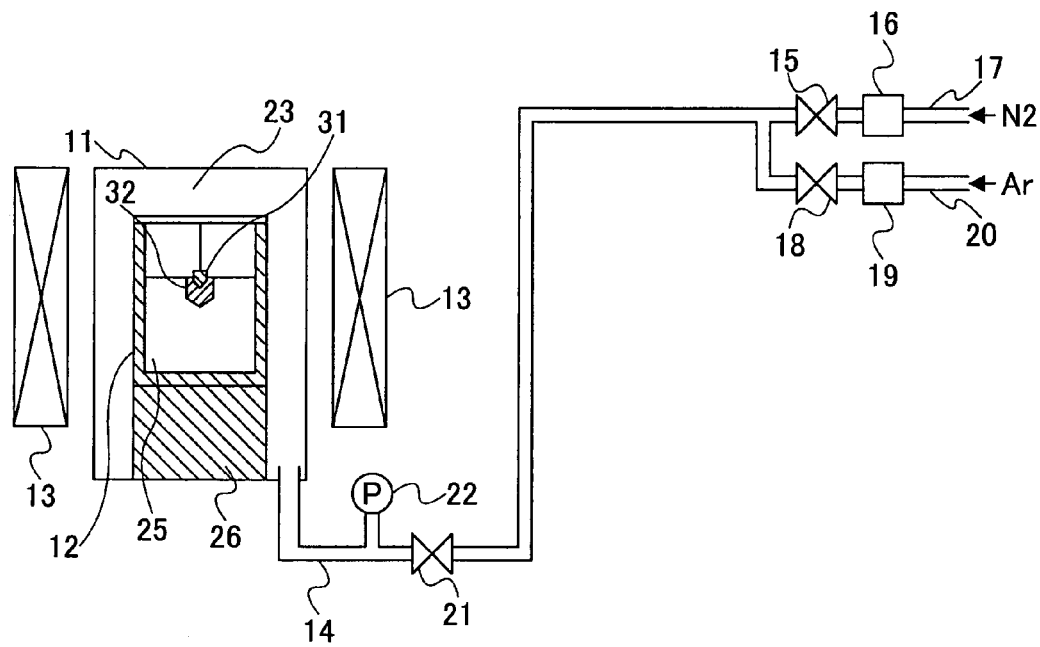
FIG. 6 is a diagram (cross-sectional view) showing an example of the crystal growth apparatus according to Example 5 of the present invention.

FIG. 6 a diagram (cross-sectional view) showing an example of the construction of the crystal growth apparatus of Example 5, wherein it should be noted that the crystal growth apparatus of FIG. 6 is the same device as that of FIG. 3 except that there is provided a mechanism for holding a seed crystal at the top part of the crucible 12.

Next, the growth method of GaN that uses this crystal growth apparatus will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further introduced as the alkali metal. The ratio of Na and Ga is set to 0.51 in terms of the ratio Na/(Na+Ga).

Next, the seed crystal 31 is suspended from the top part of crucible 12 in the state that a part of the seed crystal 31 makes contact with the melt mixture 25.

Next, the crucible 12 is provided inside the reaction vessel 11 and the reaction vessel 11 is sealed. After closing the valve 21, the interior of the reaction vessel 11 is disconnected from the external atmosphere.

Because the foregoing series of processes are conducted in the glove box of high purity Ar gas atmosphere, the interior of the reaction vessel 11 is also filled with the Ar gas.

Next, the reaction vessel 11 is taken out from the glove box and assembled into the crystal growth apparatus.

Thus, the reaction vessel 11 is provided to a specified position where the heater 13 is provided and is connected to the gas supply line 14 of the nitrogen and argon at the part of the valve 21.

Next, the heater 13 is energized with electric current and the temperature of the melt mixture 25 of Ga and Na held in crucible 12 is increased to the crystal growth temperature (775° C.) in one hour.

Next, the valves 21 and 18 are opened and the nitrogen gas is introduced into the reaction vessel 11. At this time, the nitrogen pressure is controlled to 4 MPa by using the pressure control unit 19.

Next, the valve 18 is closed and the valve 15 is opened subsequently, and the nitrogen gas is introduced into the reaction vessel 11. Thereby, the pressure control unit 16 is used to control the pressure to 8 MPa by increasing the pressure with a rate of 0.1 MPa/min. Thus, the total pressure inside the reaction vessel 11 becomes 8 MPa and the nitrogen partial pressure in the reaction vessel 11 becomes 4 MPa.

Next, the valve 21 is closed. After holding this state for 300 hours, the temperature is lowered to the room temperature.

After lowering the pressure inside the reaction vessel 11, the reaction vessel 11 was opened. It was observed that there is no formation of poly crystalline aggregate covering the melt surface. Further, it was observed that there occurred a growth in the seed crystal 31 and a colorless transparent single crystal 32 of GaN of columnar shape was formed with a size of about 8 mm.

Example 6

In Example 6, a columnar GaN single crystal was grown with the crystal growth process of any of first through third, fifth, twelfth and fifteenth embodiment, by using the crystal growth apparatus of the sixth embodiment.

Figure 7:
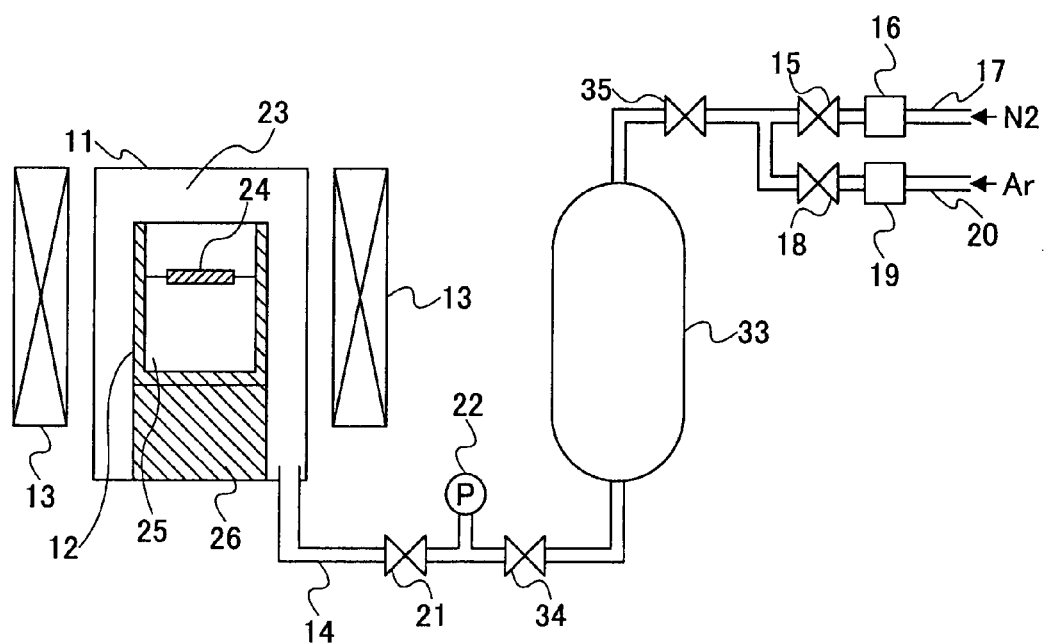
FIG. 7 is a diagram (cross-sectional view) showing an example of the crystal growth apparatus according to Example 6 of the present invention.

FIG. 7 is a diagram (cross-sectional view) showing an example of the construction of the crystal growth apparatus of Example 6, wherein the crystal growth apparatus of FIG. 7 is the one shown in of FIG. 3 in which a tank 33 for accumulating a gas us added.

Thus, the apparatus of FIG. 7 has a construction in which the crucible 12 is provided inside the reaction vessel 11 of stainless steel having a closed shape, for holding the melt mixture 25 containing the alkali metal and the group III element for conducting the crystal growth.

It should be noted that this crucible 12 can be removed from the reaction vessel 11. The container 12 is formed of BN.

Further, the gas supply line 14 is provided through the reaction vessel 11 for filling the internal space 23 of the reaction vessel 11 with the nitrogen (N$_2$) gas used for the nitrogen source material and the argon (Ar) gas and for suppressing the evaporation of the alkali metal and for enabling the control of the nitrogen (N$_2$) gas pressure and the argon (Ar) gas pressure inside the reaction vessel 11.

Further, the tank 33 is provided for storing a gas in the midway of the gas supply line 14, wherein the tank 33 is used for relaxing pressure increase inside the reaction vessel 11 the reaction vessel 11 at the time of increasing the temperature of the reaction vessel 11.

The gas supply line 14 is branched into the nitrogen supply line 17 and the argon supply line 20 which can be separated from each other with the valves 15 and 18. Further, the pressure inside the nitrogen supply line 17 and the argon supply line 20 can be adjusted by the pressure control units 16 and 19, respectively.

Further, the pressure gauge 22 is provided for monitoring the total pressure inside the reaction vessel 11.

By mixing the argon as an inert gas, it becomes possible to control the pressure of the nitrogen gas independently while controlling the evaporation of the alkali metal. With this, crystal growth with excellent controllability becomes possible.

Also, the heater 13 is provided outside of the reaction vessel 11, wherein the heater 13 can be controlled to a desired temperature.

Further, the reaction vessel 11 can be removed from the crystal growth apparatus at the valve 21 part, and it becomes possible to work on the reaction vessel 11 separately in a glove box.

Next, the growth method of GaN that uses this crystal growth apparatus will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further introduced as the alkali metal. The ratio of Na and Ga is set to 2:1. In terms of the ratio Na/(Na+Ga), this becomes 0.67.

Next, the crucible 12 is provided inside the reaction vessel 11.

Further, the reaction vessel 11 is sealed by closing the valve 21. Thereby, the interior of the reaction vessel 11 is disconnected from the external atmosphere.

Because the foregoing series of processes are conducted in the glove box of high purity Ar gas atmosphere, the interior of the reaction vessel 11 is also filled with the Ar gas.

Next, the reaction vessel 11 is taken out from the glove box and assembled into the crystal growth apparatus.

Thus, the reaction vessel 11 is provided to a specified position where the heater 13 is provided and is connected to the gas supply line 14 of the nitrogen and argon at the part of the valve 21.

Next, the valves 21, 34, 35 and 18 are opened and the Ar gas is introduced into the reaction vessel 11 from the Ar gas supply line 20. At this time, the total pressure of the tank 33 is controlled to 4 MPa by using the pressure control unit 19.

Next, the valve 18 is closed and the valve 15 is opened subsequently, and the nitrogen gas is introduced into the reaction vessel 11. Thereby, the pressure control unit 16 is used to control the total pressure of the tank 33 to 8 MPa. Thereby, the nitrogen partial pressure in the reaction vessel 11 becomes 4 MPa.

Next, the valve 35 is closed and the heater 13 is driven with an electric current such that the temperature of the reaction vessel is increased to a predetermined crystal growth temperature. The crystal growth temperature is set to 775° C. in this example.

The pressure inside the reaction vessel was held constant at 8 MPa until predetermined the crystal growth temperature has been reached. After holding this state for 300 hours, the temperature is lowered to the room temperature.

After lowering the pressure of the gas inside reaction vessel 11, the reaction vessel 11 was opened. Thereby, it was observed that there is caused no formation of polycrystalline aggregate covering the melt surface in the crucible 12, and it was further observed that a colorless transparent single crystal 24 of GaN having a size of 5 mm is formed at the melt surface.

Eighteenth Embodiment

The inventor of the present invention conducted investigation about the way of introducing the substance containing nitrogen in the early phase of the crystal growth process and case to a second aspect of the present invention.

The present invention has the feature of boosting the pressure of a substance containing nitrogen, in a crystal growth process of growing a group III nitride crystal in a reaction vessel from a melt mixture formed of an alkali metal, a group III element and the substance containing nitrogen, in accordance with temperature increase of the melt mixture.

In the present invention, it should be noted that the substance containing nitrogen means the substance in which a part thereof or entirety thereof becomes a gas that contains nitrogen as a constituent element in the crystal growth temperature. For example, it may be a gas such as a nitrogen gas or ammonia gas or a substance such as sodium azide, which is solid in the room temperature but decomposes into nitrogen gas and sodium at the crystal growth temperature of the group III nitride (in other words, the substance containing nitrogen includes nitrogen gas or the compound containing nitrogen in the constituting element such as sodium azide). The gas of the substance containing nitrogen forms a gas-liquid interface with the melt mixture, and nitrogen is supplied into the melt mixture through the gas-liquid interface.

In the present invention, the group III nitride means the compound of one or more group III elements selected from gallium, aluminum and indium and nitrogen.

With regard to the alkali metal, Na (sodium) or K (potassium) is usually used while it is possible to use other alkali metal as well.

Further, it is possible to dissolve element other than the alkali metal into the melt mixture. For example it is possible to dope an n-type impurity element or a p-type impurity element into the melt mixture for doping.

Further, in the present invention, the boosting of the temperature means increase of the temperature of the melt mixture. Also, the boosting of the pressure means increase of the pressure of the gas.

In Conventional technologies 3, 4, 5 and 6 noted before in which substance containing nitrogen is supplied from the outside at a predetermined temperature for the crystal growth of the group III nitride, there have been cased in which polycrystalline aggregate is formed to cover the melt mixture surface as a result of simultaneous formation of numerous crystal nuclei occur at the melt mixture surface.

On the other hand, the inventor of the present invention has discovered, from the investigation about introduction method of the substance containing nitrogen especially in the early phase of crystal growth, that formation of the polycrystalline aggregate is suppressed effectively by boosting the pressure of the substance containing nitrogen in accordance with the increase of temperature of the melt mixture.

Thus, in the present invention, the pressure of the substance containing nitrogen is increased or boosted gradually with increase of the temperature the melt mixture to the crystal growth temperature, and with this, it becomes possible to suppress uncontrolled formation of the crystal nuclei at the melt mixture surface. Thus, nitrogen atoms cause dissolution and diffusion into the melt mixture at the foregoing predetermined pressure and predetermined crystal growth temperature, while this leads to the growth of the group III nitride crystal as a result of bonding of the nitrogen atoms thus diffused with the group III element in the melt mixture under the presence of the alkali metal.

In the present invention, the process of boosting of the pressure of the substance containing nitrogen with increase of the temperature is not limited to a particular process.

Further, the rate of temperature increase (in other words, the boosting rate of the substance containing nitrogen) can be determined appropriately as long as the formation of the polycrystalline aggregate does not takes place.

In the eighteenth embodiment of the crystal growth process of the present invention, the group III nitride crystal is grown by introducing the substance containing nitrogen into the reaction vessel from outside of the reaction vessel and boosting the pressure thereof in accordance with the temperature increase of the melt mixture.

Thus, in the crystal growth method of the eighteenth embodiment of the present invention, the pressure of the substance containing nitrogen and introduced from the outside of the reaction vessel is increased, at the time of increasing the temperature of the melt mixture to the predetermined crystal growth temperature, gradually with the temperature increase, and the growth of the group III nitride crystal is conducted under the predetermined tempera rue and pressure.

Here, the method of boosting the pressure of the substance containing nitrogen is not limited to a particular method. For example, it is possible to increase the pressure gradually by using a pressure control unit, and the like.

Nineteenth Embodiment

In a nineteenth embodiment of the crystal growth process of the present invention, the growth of the group III nitride crystal is conducted by introducing an inert gas and a substance containing nitrogen and nitrogen into the reaction vessel from the outside of the reaction vessel and boosting the pressure of the substance containing nitrogen in accordance with the temperature increase of the melt mixture.

Thus, in the crystal growth method of the nineteenth embodiment of the present invention, an inert gas and a substance containing nitrogen is introduced into the reaction vessel from outside at the time of increasing the temperature of the melt mixture to the predetermined crystal growth temperature, and the pressure of the substance containing nitrogen and the inert gas is increased gradually with increase of the temperature. The growth of the group III nitride crystal is conducted at the predetermined temperature and predetermined pressure.

Here, it should be noted that the inert gas is used to suppress the evaporation of the alkali metal by increasing the pressure inside the reaction vessel.

Here, inert gas means a gas not reacting with the group III element or alkali metal or nitrogen, an argon gas, and the like, can be used for the inert gas, for example.

It should be noted that the inert gas may be introduced from a gas line different from the gas line used for the substance containing nitrogen. Alternatively, the inert gas can be introduced together with the substance containing nitrogen in the form of a mixture gas.

Twentieth Embodiment

In a twentieth embodiment of the crystal growth process of the present invention, the reaction vessel is sealed after introducing the substance containing nitrogen thereto at the temperature lower than the temperature in which the crystal growth is conducted, and the temperature of the reaction vessel is increased to the predetermined crystal growth temperature. Thereby, there occurs gradual increase in the pressure of the substance containing nitrogen and confined in the reaction vessel with the increase of the temperature, and associated therewith, there occurs a gradual increase in the concentration of nitrogen dissolved into the melt mixture. Thus, at the predetermined crystal growth temperature, the nitrogen atoms dissolved in to the melt mixture cause bonding with the group III element in the melt mixture under the existence of the alkali metal and the desired growth of the group III nitride crystal is achieved.

While it is desirable that the pressure of the substance containing nitrogen has reached the predetermined pressure at time when the temperature has reached the crystal growth temperature, it is also possible that the pressure exceeds the foregoing pressure. In such a case, the pressure is merely decreased to the predetermined pressure by opening or closing a valve, and the like, separating the reaction vessel from the outside environment.

As the pressure increase rate of the substance containing nitrogen is proportional with the amount of increase of the temperature, it is possible to control the boosting rate of the pressure of the gas of the substance containing nitrogen. Thereby, the temperature increase rate can be determined appropriately as long as there occurs no formation of the polycrystalline aggregate.

In one example of this embodiment, the reaction vessel is sealed after the substance containing nitrogen is introduced into the reaction vessel with such an amount that the partial pressure of the foregoing substance in the reaction vessel becomes a predetermined pressure when the temperature of the reaction vessel is increased to the foregoing predetermined crystal growth temperature. The growth of the group III nitride crystal is conducted thereafter, with the foregoing predetermined crystal growth temperature.

Thus, in this example, the preparation quantity of the nitrogen source material is adjusted such that the pressure of the substance containing nitrogen in the gas phase in the reaction vessel becomes the predetermined pressure for crystal growth when the temperature of the reaction vessel has reached the crystal growth temperature. Thereafter, the reaction vessel is tightly sealed and the temperature is increased. With this, crystal growth is conducted at the predetermined crystal growth temperature and pressure.

Twenty-First Embodiment

In a twenty-first embodiment of the crystal growth process of the present invention, the reaction vessel is sealed after introducing thereto the substance containing nitrogen and an inert gas. Thereafter, the temperature of the melt mixture is increased to the temperature for the crystal growth and growth of the group III nitride crystal is conducted.

Again, the inert gas is used to suppress the evaporation of the alkali metal by increasing the pressure inside the reaction vessel similarly, with the case of the nineteenth embodiment.

Here, the inert gas means a gas not reacting with the group III element or the alkali metal or nitrogen and it is possible to use an argon gas, and the like for the inert gas.

In the crystal growth process of the twenty-first embodiment, the substance containing nitrogen used for the nitrogen source and an inert gas are introduced into the reaction vessel at a temperature lower than the temperature for conducing the crystal growth. Thereafter, the reaction vessel is sealed and heated to the predetermined crystal growth temperature. Thereby, the pressure of the substance containing nitrogen and the inert gas in the sealed reaction vessel increases gradually with increase of the temperature. With this, the concentration of nitrogen dissolved into the melt mixture increases gradually, and growth of the group III nitride crystal is achieved at the predetermined crystal growth temperature as a result of the nitrogen atoms diffused into the melt mixture causing bonding with the group III element under existence of the alkali metal.

While it is preferable that the pressure of the substance containing nitrogen and the inert gas becomes equal to the pressure for conducting the crystal growth at the moment the crystal growth temperature has been reached, it is also possible that the pressure exceeds the foregoing predetermined pressure. In this case, the pressure can be reduced to the predetermined pressure by opening or closing the valve separating the reaction vessel from the outside environment.

Because the amount of increase of the pressure of the substance containing nitrogen and the inert gas is proportional to the amount of increase of the temperature, it is possible to control the boosting rate of the gas pressure of the substance containing nitrogen by controlling the rate of temperature increase.

In an example of the crystal growth method according to the twenty-first embodiment of the present invention, the reaction vessel is sealed after the substance containing nitrogen and the inert gas are introduced into the reaction vessel with such an amount that the partial pressure of the substance containing nitrogen and the partial pressure of the inert gas become the respective predetermined pressure values in the reaction vessel when the temperature of the reaction vessel has reached the predetermined crystal growth temperature. Thereafter, the reaction vessel is heated to the foregoing predetermined crystal growth temperature and the desired growth of the group III nitride crystal is achieved.

Thus, in this example, the preparation quantity of the nitrogen source material and the pressure of the inert gas are adjusted at the time of introducing the substance containing nitrogen and the inert gas into the reaction vessel, such that the pressure of the substance containing nitrogen and the pressure of the inert gas in the gas phase in the reaction vessel become the respective predetermined pressure values at the predetermined crystal growth temperature. Thereafter, the reaction vessel is sealed and the temperature thereof is increased, and the crystal growth is conducted at the predetermined crystal growth temperature and pressure.

By using the crystal growth process of the present invention, it becomes possible to grow a group III nitride crystal of plate-like form.

Here, it should be noted that the plate-like group III nitride crystal may be the crystal of hexagonal crystal system or cubic crystal system.

By using the crystal growth process of the present invention, it becomes possible to grow a group III nitride crystal of columnar form.

Here, it should be noted that the columnar group III nitride crystal may be the crystal of hexagonal crystal system or cubic crystal system.

Further, it is possible to grow the group III nitride crystal on a seed crystal in the crystal growth process of the group III nitride of the present invention.

In the crystal growth process of the group III nitride of the present invention noted above, it is possible to grow the group III nitride crystal in the vicinity of the melt mixture surface in any of the cases of growing the plate-like group III nitride crystal or the columnar group III nitride crystal or growing the group III nitride crystal on a seed crystal.

More specifically, it is possible to grown a GaN single crystal of plate-like form by using the crystal growth process of group III nitride of the present invention. For example, it is possible to grow a plate-like single crystal of GaN of hexagonal crystal system and having a hexagonal principal surface, with the principal surface orientation, diagonal length of the principal surface, thickness, dislocation density (measured by TEM) and color as summarized in table below (Table 1).

TABLE 1

| Surface orientation | Diagonal length | Thickness | Dislocation density | Color |
|---|---|---|---|---|
| C surface | ≧3 mm | ≧80 μm | ≦$10^6$ cm$^{-2}$ | colorless |

Further, it is possible to grow a columnar single crystal of GaN by using the crystal growth method of group III nitride of the present invention. For example, it is possible to grow a columnar single crystal of GaN of hexagonal crystal system, with length in the direction of C axis, width, dislocation density (measured by TEM) and color as summarized in table below (Table 2).

TABLE 2

| C axis length | Width | Dislocation density | color |
|---|---|---|---|
| ≧5 mm | ≧1 mm | ≦$10^6$ cm$^{-2}$ | colorless |

Example 7

In Example 7, a columnar GaN single crystal is grown in the vicinity of the melt mixture surface by introducing a substance containing nitrogen into the reaction vessel from the outside and by boosting or increasing the pressure thereof in accordance with the increase of the temperature of the melt mixture.

In Example 7, a gallium nitride (GaN) crystal is grown by using gallium (Ga) for the group III element, sodium (Na) for the alkali metal and nitrogen gas ($N_2$) for the substance containing nitrogen.

Figure 8:
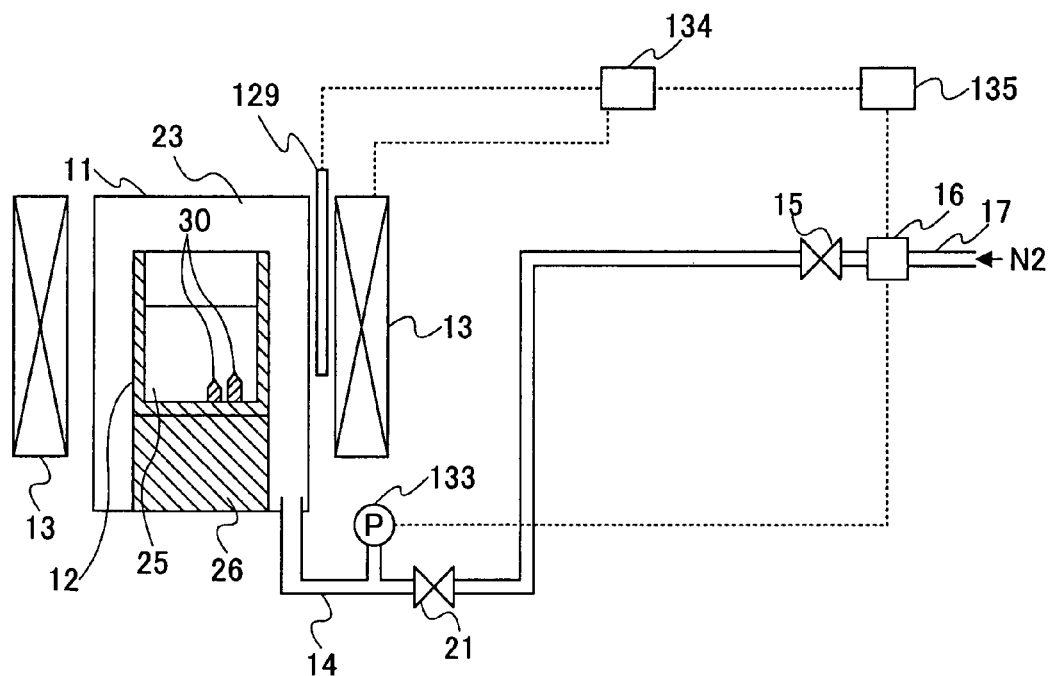
FIG. 8 is a diagram (cross-sectional view) showing an example of the crystal growth apparatus used in Example 7 of the present invention.

FIG. 8 is a diagram (cross-sectional view) showing an example of the crystal growth apparatus used in Example 7. In the crystal growth apparatus of FIG. 8, the crucible 12 is provided for holding a melt mixture 25 and for causing the crystal growth in the reaction vessel 11 of stainless steed having a closed shape. This crucible 12 can be removed from the reaction vessel 11 and is formed of BN.

Further, the gas supply tube 14 is provided through the reaction vessel 11 for filling the internal space 23 of the reaction vessel 11 with nitrogen ($N_2$) gas used for the nitrogen source and for enabling the control of the nitrogen ($N_2$) pressure inside the reaction vessel 11.

The reaction vessel 11 can be removed from the crystal growth apparatus at the valve part 21, and it is possible to work on the reaction vessel 11 in a glove box.

Further, the heater 13 is provided outside the reaction vessel 11. The temperature of the heater 13 is monitored by the temperature sensor 129 and the monitor signal of the temperature sensor 129 is supplied to the temperature controller 134, wherein the temperature controller 134 controls the temperature of the sensor 129 in response to the monitor signal of the temperature sensor 129. This temperature controller 134 can also control the duration of the temperature increase and the duration for holding a constant temperature. Because the correspondence between the temperature of the heater 13 and the temperature of the melt mixture 25 is already calibrated, it is possible to control the temperature of the melt mixture 25 by controlling the temperature of the heater 13.

Further, in order to boost the pressure of the nitrogen gas in accordance with the increase of the temperature, there is provided a processing unit 135, wherein the processing unit 135 receives a signal from the temperature controller 134 and issues a control signal corresponding to the temperature to the pressure control unit 16. Thereby, the pressure control unit 16 carries out the control of the pressure inside the reaction vessel 11.

The pressure inside the reaction vessel 11 is monitored by a pressure sensor 133, and a monitor signal of the pressure sensor 133 is supplied to the pressure control unit 16. The pressure control unit 16 thereby controls the pressure inside the reaction vessel 11 to a predetermined pressure.

Next, the growth method of GaN that uses the crystal growth apparatus of FIG. 8 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 0.51 in terms of the ratio Na/(Na+Ga).

Next, the crucible 12 is introduced into the reaction vessel 11. Further, the reaction vessel 11 is sealed and the valve 21 is closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 15 and 21 are opened.

Next, the heater 13 is energized with electric current and the temperature of the melt mixture 25 is increased to the crystal growth temperature set to 775° C. Thereby, the temperature increase is conducted from the room temperature (27° C.) to 775° C. with one hour. Thereby, the temperature increase rate becomes 748° C./hour.

Further, the pressure of nitrogen inside the reaction vessel 11 is increased with the increase of temperature of the melt mixture 25. Thus, the pressure increase is started from 0 MPa at the room temperature (the state in which no nitrogen is introduced into the reaction vessel) to 7 MPa after one hour when the temperature has reached the crystal growth temperature of 775° C. In this case, the pressure increase rate of nitrogen is 7 MPa/h.

After the crystal growth temperature of 775° C. and the nitrogen pressure of 7 MPa are reached, crystal growth is conducted by holding the reaction vessel in this state for 320 hours. After the crystal growth, the reaction vessel 11 is opened and it was confirmed that there is no formation of the polycrystalline aggregate in the crucible 12 covering the melt surface. Further, it was observed that a colorless transparent GaN single crystal 30 of columnar form was grown at the bottom of the crucible 12 with a length of about 5 mm in the direction of C axis.

As a result of the scanning microscopic observation made for the C surface of the columnar GaN crystal grown with the conditions noted above, it was observed that a crystal having a size of 1 mm or more in the diagonal direction is formed. Further, the dislocation density obtained by observation of the transmission electron microscope was $10^6$ cm$^{-2}$ or less.

Example 8

In Example 8, a columnar GaN single crystal is grown by introducing an inert gas and a substance containing nitrogen from outside of the reaction vessel and by increasing the pressure of the substance containing nitrogen with increase of temperature of the melt mixture.

In Example 8, a gallium nitride (GaN) crystal is grown by using gallium (Ga) for the group III element, sodium (Na) for the alkali metal, nitrogen gas ($N_2$) for the substance containing nitrogen and Ar for the gas (inert gas) suppressing the evaporation of Na.

Figure 9:
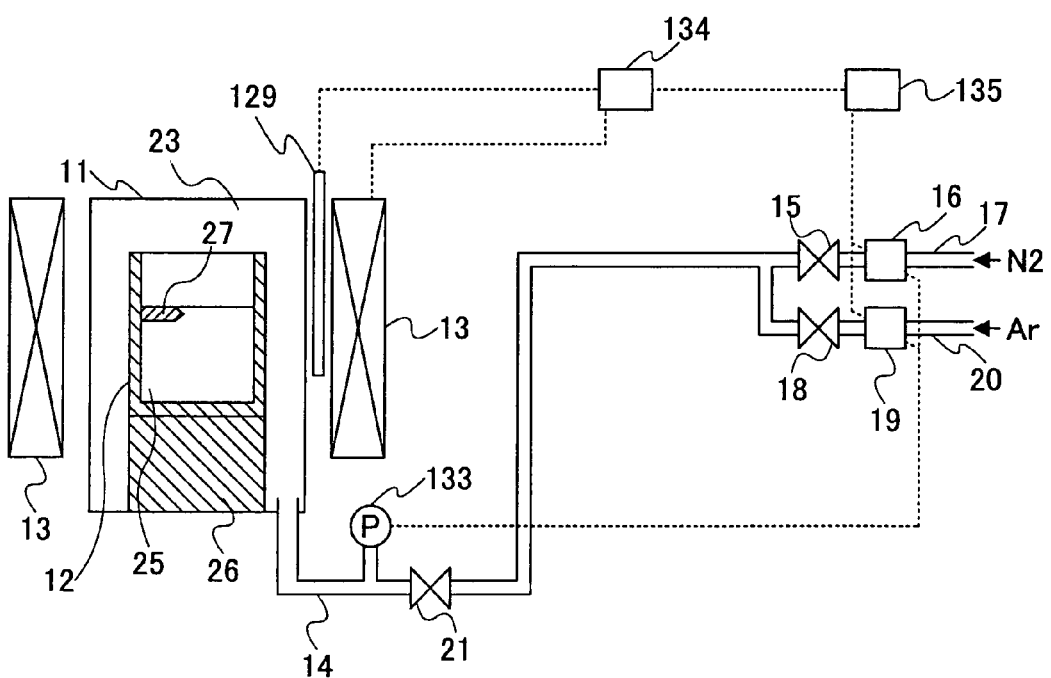
FIG. 9 is a diagram (cross-sectional view) showing an example of the crystal growth apparatus used in Example 8 of the present invention.

FIG. 9 is a diagram (cross-sectional view) showing an example of the crystal growth apparatus used in Example 8. The crystal growth apparatus of FIG. 9 has a construction in which the Ar gas supply line 20 is added to the apparatus of FIG. 8.

Thus, in the apparatus of FIG. 9, the crucible 12 is provided for holding a melt mixture 25 and for causing the crystal growth in the reaction vessel 11 of stainless steed having a closed shape. This crucible 12 can be removed from the reaction vessel 11 and is formed of BN.

Further, the gas supply tube 14 is provided through the reaction vessel 11 for filling the internal space 23 of the reaction vessel 11 with the nitrogen ($N_2$) gas used for the nitrogen source and with the argon (Ar) gas for suppressing the evaporation of the alkali metal and further for enabling the control of the nitrogen ($N_2$) pressure and the argon (Ar) gas pressure inside the reaction vessel 11.

In the apparatus of FIG. 9, the gas supply line 14 is branched into the nitrogen supply line 17 and the argon supply line 20 separable from each other by the valves 15 and 18. Further, it is possible to control the pressure of the nitrogen gas and the argon gas separately by using the pressure control units 16 and 19, respectively. With this, it becomes possible to adjust the pressure of the nitrogen gas independently while suppressing the evaporation of the alkali metal, and crystal growth with excellent controllability becomes possible.

Further, the heater 13 is provided outside the reaction vessel 11. The temperature of the heater 13 is monitored by the temperature sensor 129 and the monitor signal of the temperature sensor 129 is supplied to the temperature controller 134, wherein the temperature controller 134 controls the temperature of the sensor 129 in response to the monitor signal of the temperature sensor 129. This temperature controller 134 can also control the duration of the temperature increase and the duration for holding a constant temperature. Because the correspondence between the temperature of the heater 13 and the temperature of the melt mixture 25 is already calibrated, it is possible to control the temperature of the melt mixture 25 by controlling the temperature of the heater 13.

Further, in order to boost the pressure of the nitrogen gas in accordance with the increase of the temperature, there is provided a processing unit 135, wherein the processing unit 135 receives a signal from the temperature controller 134 and issues a control signal corresponding to the temperature to the pressure control unit 16 and to the pressure control unit 19. Thereby, the pressure control units 16 and 19 carry out the control of the pressure of nitrogen and Ar inside the reaction vessel 11.

The pressure inside the reaction vessel 11 is monitored by a pressure sensor 133, and a monitor signal of the pressure sensor 133 is supplied to the pressure control units 16 and 19. The pressure control units 16 and 19 thereby control the pressure inside the reaction vessel 11 to a predetermined pressure.

It should be noted that the reaction vessel 11 can be removed from the crystal growth apparatus at the part of the valve 21, and it is possible to work on the reaction vessel 11 in a glove box.

Next, the growth method of GaN that uses the crystal growth apparatus of FIG. 9 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 0.51 in terms of the ratio Na/(Na+Ga).

Next, the crucible 12 is introduced into the reaction vessel 11. Further, the reaction vessel 11 is sealed and the valve 21 is closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 21, 15 and 18 are opened.

Next, the heater 13 is energized with electric current and the temperature of the melt mixture 25 is increased to the crystal growth temperature set to 775° C. Thereby, the temperature increase is conducted from the room temperature (27° C.) to 775° C. with one hour. Thereby, the temperature increase rate becomes 748° C./hour.

Further, the pressure of nitrogen and Ar inside the reaction vessel 11 is increased with the increase of temperature of the melt mixture. Thus, the pressure increase is started from 0 MPa at the room temperature (the state in which no nitrogen is introduced into the reaction vessel) to 4 MPa after one hour when the temperature has reached the crystal growth temperature of 775° C. In this case, the pressure increase rate of nitrogen is 4 MPa/h.

After the crystal growth temperature of 775° C. is reached, crystal growth is conducted by holding the reaction vessel in this state for 320 hours. After the crystal growth, the reaction vessel 11 is opened and it was confirmed that there is no formation of the polycrystalline aggregate in the crucible 12 covering the melt surface. Further, it was observed that a colorless transparent GaN single crystal 27 of columnar form was grown at the inner wall of the crucible 12 neat the melt mixture surface with a length of about 6 mm in the direction of C axis.

As a result of the scanning microscopic observation made for the C surface of the columnar GaN crystal grown with the conditions noted above, it was observed that a crystal having a size of 1 mm or more in the diagonal direction is formed. Further, the dislocation density obtained by observation of the transmission electron microscope was $10^6$ cm$^{-2}$ or less.

Example 9

In Example 9, a plate-like GaN single crystal was grown by introducing an inert gas and a substance containing nitrogen from outside of the reaction vessel and by increasing the pressure of the substance containing nitrogen with increase of temperature of the melt mixture.

In Example 9, a gallium nitride (GaN) crystal is grown by using gallium (Ga) for the group III element, sodium (Na) for the alkali metal, nitrogen gas ($N_2$) for the substance containing nitrogen and Ar for the gas suppressing the evaporation of Na.

Figure 10:
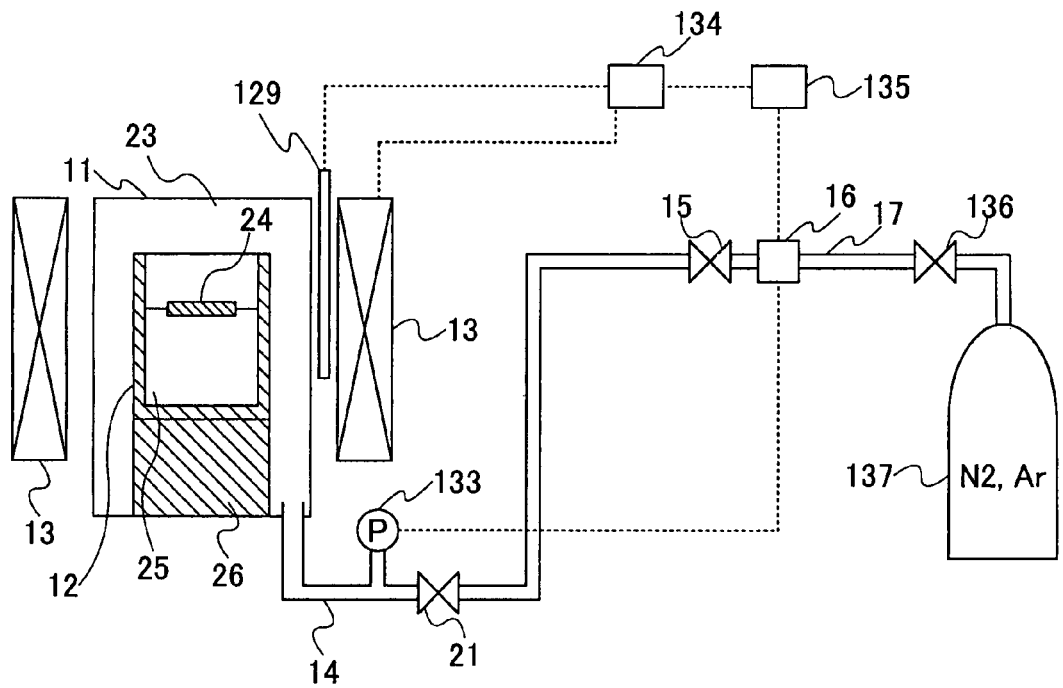
FIG. 10 is a diagram (cross-sectional view) showing an example of the crystal growth apparatus used in Example 9 of the present invention.

FIG. 9 is a diagram (cross-sectional view) showing an example of the crystal growth apparatus used in Example 11. In the crystal growth apparatus of FIG. 10, the gas supply line 14 is used for supplying a mixed gas of nitrogen and Ar. In order to clarify this feature, FIG. 10 shows a gas cylinder 137 holding a mixed gas of nitrogen and Ar and a valve 136 cooperating with the gas cylinder 137.

Next, the growth method of GaN that uses the crystal growth apparatus of FIG. 10 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 0.67 in terms of the ratio Na/(Na+Ga).

Next, the crucible 12 is introduced into the reaction vessel 11. Further, the reaction vessel 11 is sealed and the valve 21 is closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 15 and 21 are opened.

Next, the heater 13 is energized with electric current and the temperature of the melt mixture 25 is increased to the crystal growth temperature set to 775° C. Thereby, the temperature increase is conducted from the room temperature (27° C.) to 775° C. with one hour. Thereby, the temperature increase rate becomes 748° C./hour.

Further, the pressure of nitrogen and Ar inside the reaction vessel 11 is increased with the increase of temperature of the melt mixture. Thus, the pressure increase is started from 0 MPa at the room temperature (the state in which no nitrogen is introduced into the reaction vessel) to 4 MPa after one hour when the temperature has reached the crystal growth temperature of 775° C. In this case, the pressure increase rate of nitrogen is 4 MPa/h.

After the crystal growth temperature of 775° C. and the total pressure of 8 MPa (nitrogen partial pressure 4 MPa) is reached, crystal growth is conducted by holding the reaction vessel in this state for 300 hours. After the crystal growth, the reaction vessel 11 is opened and it was confirmed that there is no formation of the polycrystalline aggregate in the crucible 12 covering the melt surface. Further, it was observed that a colorless transparent GaN single crystal 24 of plate-like form was grown at the melt surface with a diagonal length of about 5 mm. The crystal thus grown had a principal surface formed of C surface.

As a result of the scanning microscopic observation made for cross-sectional surface parallel to the C axis of the plate-like GaN crystal grown with the conditions noted above, it was observed that the crystal has a thickness of 80 µm or more. Further, the dislocation density obtained by observation of the transmission electron microscope was $10^6$ cm$^{-2}$ or less.

Example 10

In Example 10, a plate-like GaN single crystal is grown by introducing a substance containing nitrogen and by increasing the temperature of the melt mixture to the crystal growth temperature.

In Example 10, a gallium nitride (GaN) crystal is grown by using gallium (Ga) for the group III element, sodium (Na) for the alkali metal, nitrogen gas ($N_2$) for the substance containing nitrogen and Ar for the gas suppressing the evaporation of Na.

Figure 11:
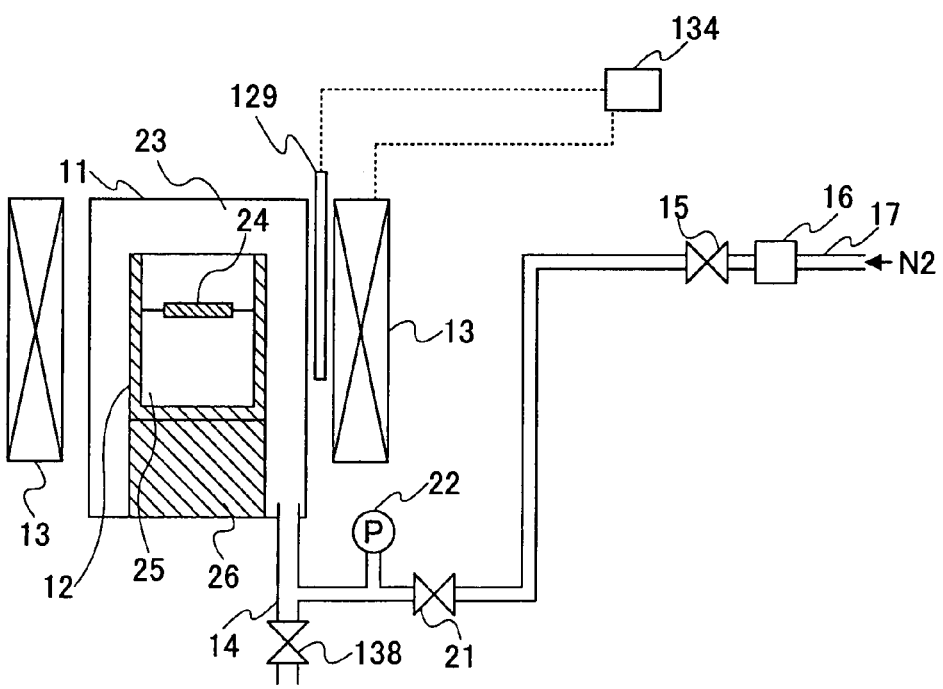
FIG. 11 is a diagram (cross-sectional view) showing an example of the crystal growth apparatus used in Example 10 of the present invention.

FIG. 11 is a diagram (cross-sectional view) showing an example of the crystal growth apparatus used in Example 10. In the crystal growth apparatus of FIG. 11, the crucible 12 for holding the melt mixture 25 containing the alkali metal and the group III element is provided. This crucible 12 can be removed from the reaction vessel 11 and is formed of BN.

Further, the gas supply tube 14 is provided through the reaction vessel 11 for filling the internal space 23 of the reaction vessel 11 with the nitrogen ($N_2$) gas used for the nitrogen source and for enabling the control of the nitrogen ($N_2$) pressure inside the reaction vessel 11. Thereby, the pressure of the nitrogen gas is controlled by the pressure control unit 16 and the total pressure inside the reaction vessel 11 is monitored by providing the pressure gauge 22.

Further, a gas vent valve 138 is provided in the apparatus of FIG. 11 for discharging the gas to the outside in the case that the pressure inside the reaction vessel 11 has exceeded a specified pressure.

Further, the heater 13 is provided outside the reaction vessel 11. The temperature of the heater 13 is monitored by the temperature sensor 129 and the monitor signal of the temperature sensor 129 is supplied to the temperature controller 134, wherein the temperature controller 134 controls the temperature of the sensor 129 in response to the monitor signal of the temperature sensor 129. This temperature controller 134 can also control the duration of the temperature increase and the duration for holding a constant temperature. Because the correspondence between the temperature of the heater 13 and the temperature of the melt mixture 25 is already calibrated, it is possible to control the temperature of the melt mixture 25 by controlling the temperature of the heater 13.

The reaction vessel 11 can be removed from the crystal growth apparatus at the part of the valve 21, and it is possible to work on the reaction vessel 11 in a glove box.

Next, the growth method of GaN that uses the crystal growth apparatus of FIG. 11 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 2:1 or 0.67 in terms of the ratio Na/(Na+Ga).

Next, the crucible 12 is introduced into the reaction vessel 11. Further, the reaction vessel 11 is sealed and the valve 21 is closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 15 and 21 are opened and the nitrogen gas is introduced in the reaction vessel. Thereby, the nitrogen pressure is set to 3.5 MPa by using the pressure control unit 16.

Next the valve 21 is closed and the reaction vessel is sealed.

Next, the heater 13 is energized with electric current and the temperature of the melt mixture 25 is increased to the crystal growth temperature set to 775° C. from the room temperature (27° C.). Thereby, the temperature increase rate becomes 748° C./hour.

Thereby, the pressure of nitrogen inside the reaction vessel 11 is increased with increase of temperature and the nitrogen pressure in the reaction vessel 11 becomes 4.5 MPa at the time the temperature has reached the crystal growth temperature of 775° C. In this case, the pressure increase rate of nitrogen is 1 MPa/h. Because this pressure of 4.5 MPa exceeds the predetermined crystal growth pressure, the gas vent valve 138 is opened for discharging the nitrogen gas. With this, the pressure of nitrogen is set to 4 MPa.

After holding this state for 300 hours, the temperature is lowered to the room temperature and the reaction vessel 11 is opened and it was confirmed that there is no formation of the polycrystalline aggregate in the crucible 12 covering the melt surface. Further, it was observed that a colorless transparent GaN single crystal 24 of hexagonal plate-like form was grown at the melt surface with and a diagonal length of about 5 mm. The GaN single crystal thus formed had a principal surface formed by c surface.

As a result of the scanning microscopic observation made for cross-sectional surface parallel to the C axis of the plate-like GaN crystal grown with the conditions noted above, it was observed that the crystal has a thickness of 80 μm or more. Further, the dislocation density obtained by observation of the transmission electron microscope was $10^6$ cm$^{-2}$ or less.

Example 11

In Example 11, a plate-like GaN single crystal is grown by introducing a substance containing nitrogen with an amount determined such that the partial pressure of the substance becomes a predetermined pressure value in the reaction vessel at the predetermined crystal growth temperature. Thereafter, the reaction vessel is sealed and the temperature is increased to the predetermined crystal growth temperature.

In Example 11, a gallium nitride (GaN) crystal is grown by using gallium (Ga) for the group III element, sodium (Na) for the alkali metal, and nitrogen gas ($N_2$) for the substance containing nitrogen.

Figure 12:
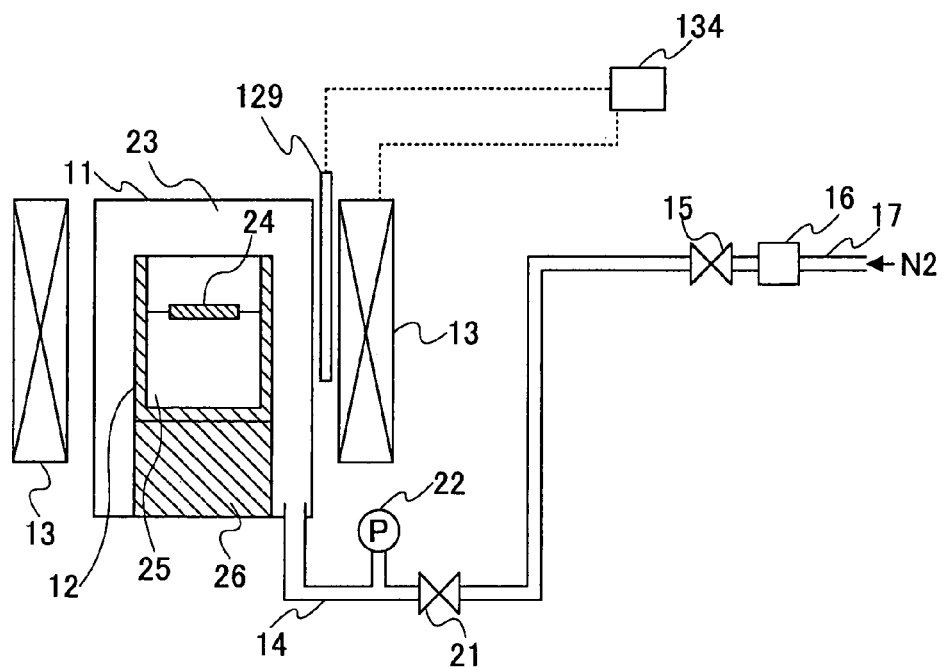
FIG. 12 is a diagram (cross-sectional view) showing an example of the crystal growth apparatus used in Example 11 of the present invention.

FIG. 12 is a diagram (cross-sectional view) showing an example of the crystal growth apparatus used in Example 11. In the crystal growth apparatus of FIG. 12, the crucible 12 for holding the melt mixture 25 containing the alkali metal and the group III element is provided. This crucible 12 can be removed from the reaction vessel 11 and is formed of BN.

Further, the gas supply tube 14 is provided through the reaction vessel 11 for filling the internal space 23 of the reaction vessel 11 with the nitrogen ($N_2$) gas used for the nitrogen source and for enabling the control of the nitrogen ($N_2$) pressure inside the reaction vessel 11. Thereby, the pressure of the nitrogen gas is controlled by the pressure control unit 16 and the total pressure inside the reaction vessel 11 is monitored by providing the pressure gauge 22.

Further, the heater 13 is provided outside the reaction vessel 11. The temperature of the heater 13 is monitored by the temperature sensor 129 and the monitor signal of the temperature sensor 129 is supplied to the temperature controller 134, wherein the temperature controller 134 controls the temperature of the sensor 129 in response to the monitor signal of the temperature sensor 129. This temperature controller 134 can also control the duration of the temperature increase and the duration for holding a constant temperature. Because the correspondence between the temperature of the heater 13 and the temperature of the melt mixture 25 is already calibrated, it is possible to control the temperature of the melt mixture 25 by controlling the temperature of the heater 13.

The reaction vessel 11 can be removed from the crystal growth apparatus at the part of the valve 21, and it is possible to work on the reaction vessel 11 in a glove box.

Next, the growth method of GaN that uses the crystal growth apparatus of FIG. 12 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 2:1 or 0.67 in terms of the ratio Na/(Na+Ga).

Next, the crucible 12 is introduced into the reaction vessel 11. Further, the reaction vessel 11 is sealed and the valve 21 is closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 15 and 21 are opened and the nitrogen gas is introduced in the reaction vessel. Thereby, the nitrogen pressure was set to 3.3 MPa by using the pressure control unit 16. By setting the pressure to this pressure of 3.5 MPa, the total pressure inside the reaction vessel 11 becomes 4 MPa when the temperature of the apparatus of FIG. 12 is increased from the room temperature and reached the crystallization temperature of 775° C.

Next the valve 21 is closed and the reaction vessel is sealed.

Next, the heater 13 is energized with electric current and the temperature of the melt mixture 25 is increased to the crystal growth temperature set to 775° C. from the room temperature (27° C.). Thereby, the temperature increase rate becomes 748° C./hour.

Thereby, the pressure of nitrogen inside the reaction vessel 11 is increased with increase of temperature and the nitrogen pressure in the reaction vessel 11 becomes 4 MPa at the time the temperature has reached the crystal growth temperature of 775° C. In this case, the pressure has increased from 3.3 MPa (room temperature 27° C.) to 4 MPa (775° C.). Thereby, the pressure increase rate of nitrogen is 0.7 MPa/h.

After holding this state for 300 hours, the temperature is lowered to the room temperature and the reaction vessel 11 is opened and it was confirmed that there is no formation of the polycrystalline aggregate in the crucible 12 covering the melt surface. Further, it was observed that a colorless transparent GaN single crystal 24 of hexagonal plate-like form was grown at the melt surface with and a diagonal length of about 5 mm. The GaN single crystal thus formed had a principal surface formed by c surface.

As a result of the scanning microscopic observation made for cross-sectional surface parallel to the C axis of the plate-like GaN crystal grown with the conditions noted above, it was observed that the crystal has a thickness of 80 μm or more. Further, the dislocation density obtained by observation of the transmission electron microscope was $10^6$ cm$^{-2}$ or less.

Example 12

In Example 12, a plate-like GaN single crystal is grown as a group III nitride crystal by sealing the reaction vessel after introducing thereto a substance containing nitrogen an inert gas and further by increasing the temperature of the melt mixture to the growth temperature.

In Example 12, a gallium nitride (GaN) crystal is grown by using gallium (Ga) for the group III element, sodium (Na) for the alkali metal, nitrogen gas ($N_2$) for the substance containing nitrogen and Ar for the inert gas suppressing the evaporation of Na.

Figure 13:
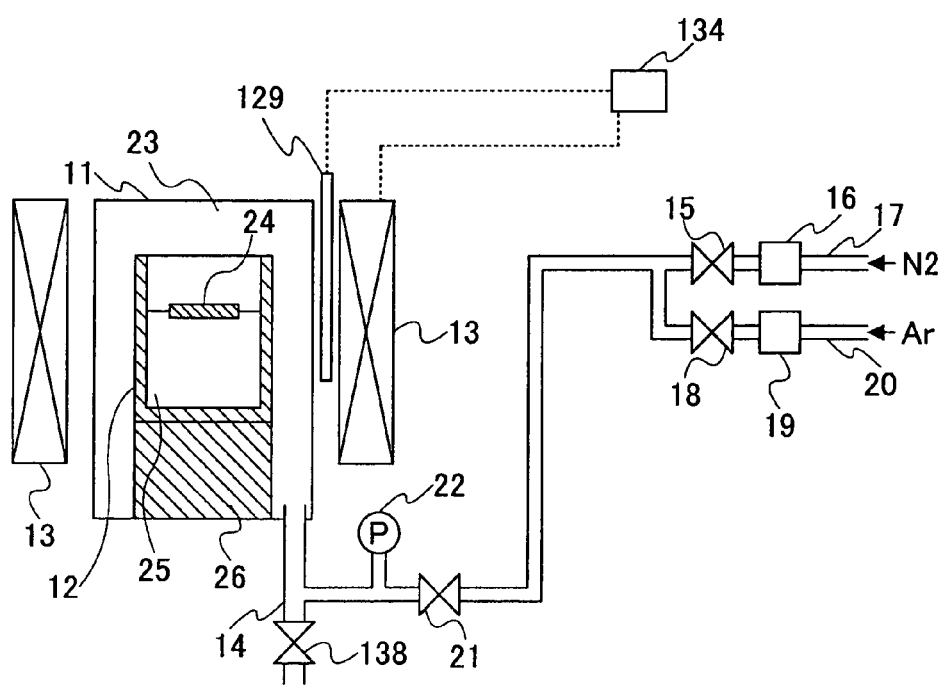
FIG. 13 is a diagram (cross-sectional view) showing an example of the crystal growth apparatus used in Example 12 of the present invention.

FIG. 13 is a diagram (cross-sectional view) showing an example of the crystal growth apparatus used in Example 12. In the crystal growth apparatus of FIG. 13, the Ar gas supply line 20 is added to the apparatus of FIG. 11.

Next, the growth method of GaN that uses the crystal growth apparatus of FIG. 13 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 2:1 or 0.67 in terms of the ratio Na/(Na+Ga).

Next, the crucible 12 is introduced into the reaction vessel 11. Further, the reaction vessel 11 is sealed and the valves 15, 18 and 21 are closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 15 and 21 are opened and the nitrogen gas is introduced into the reaction vessel. Thereby, the pressure control unit 16 is used to set the nitrogen pressure to 3.5 MPa.

Next the valve 15 is closed.

Next, the valve 18 is opened and the Ar gas is introduced into the reaction vessel 11. Thereby, the pressure control unit 19 is used to set the pressure to 7 MPa. Thereby, the Ar pressure in the reaction vessel 11 becomes 3.5 MPa.

Next, the valve 18 and the valve 21 are closed and the reaction vessel 11 is tightly sealed.

Next, the heater 13 is energized with electric current and the temperature of the melt mixture 25 is increased to the crystal growth temperature set to 775° C. from the room temperature (27° C.) in one hour. Thereby, the temperature increase is conducted from the room temperature (27° C.) to 775° C. with one hour. Thereby, the temperature increase rate becomes 748° C./hour.

The pressure inside the sealed reaction vessel 11 is increased with the increase of temperature, and the total pressure inside the reaction vessel 11 becomes 9 MPa at the time when the temperature has reached the crystal growth temperature 775° C. Thereby, the partial pressure of nitrogen and the partial pressure of Ar become 4.5 MPa for each, and the pressure increase rate becomes 1 MPa/hour.

Because this pressure exceeds the predetermined crystal growth pressure, the gas vent valve is opened for discharging the gas, and the total pressure is set to 8 MPa. In this state, both of nitrogen and Ar has the partial pressure of 4 MPa.

After holding this state for 300 hours, the gas pressure in the reaction vessel is lowered. When the reaction vessel 11 was opened, it confirmed that there is no formation of the polycrystalline aggregate in the crucible 12 covering the melt surface. Further, it was observed that a colorless transparent GaN single crystal 24 of hexagonal plate-like form was grown at the melt surface with a diagonal length of about 5 mm. The crystal thus grown had a principal surface formed of C surface.

As a result of the scanning microscopic observation made for cross-sectional surface parallel to the C axis of the plate-like GaN crystal grown with the conditions noted above, it was observed that the crystal has a thickness of 80 μm or more. Further, the dislocation density obtained by observation of the transmission electron microscope was $10^6$ cm$^{-2}$ or less.

Example 13

In Example 13, a columnar GaN single crystal is grown by introducing a substance containing nitrogen together with an inert gas with an amount determined such that the partial pressure of the substance and the partial pressure of the inert gas become predetermined pressure values in the reaction vessel at the predetermined crystal growth temperature. Thereafter, the reaction vessel is sealed and the temperature is increased to the predetermined crystal growth temperature.

In Example 13, a gallium nitride (GaN) crystal is by using gallium (Ga) for the group III element, sodium (Na) for the alkali metal, nitrogen gas ($N_2$) for the substance containing nitrogen and Ar for the gas suppressing the evaporation of Na.

Figure 14:
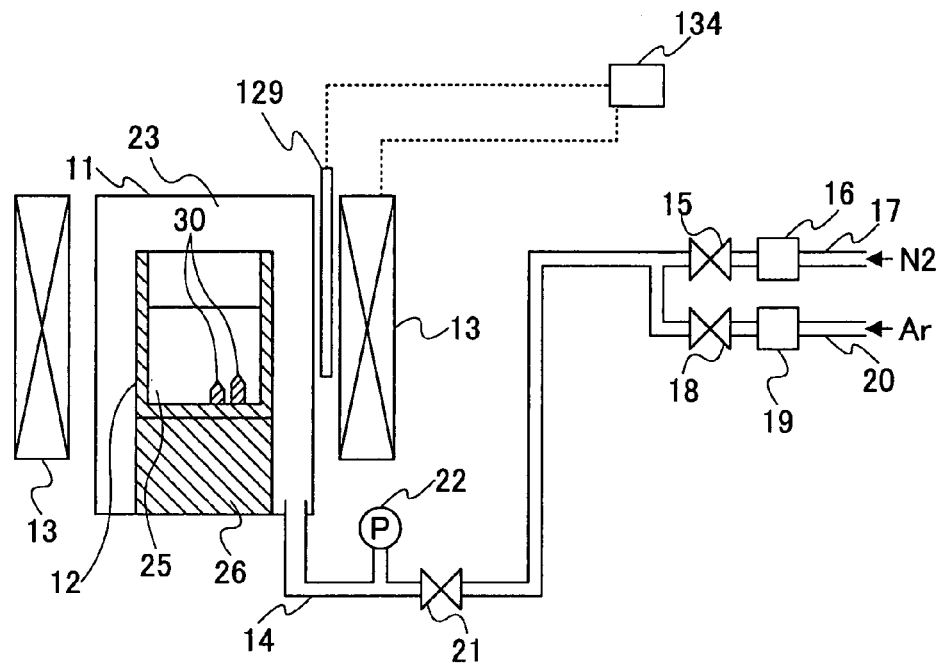
FIG. 14 is a diagram (cross-sectional view) showing an example of the crystal growth apparatus used with in Example 13 of the present invention.

FIG. 14 is a diagram (cross-sectional view) showing an example of the crystal growth apparatus used in Example 13. In the crystal growth apparatus of FIG. 14, the Ar gas supply line 20 is added to the apparatus of FIG. 12.

Next, the growth method of GaN that uses the crystal growth apparatus of FIG. 14 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 0.51 in terms of the ratio Na/(Na+Ga).

Next, the crucible 12 is introduced into the reaction vessel 11. Further, the reaction vessel 11 is sealed and the valve 21 is closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 15 and 21 are opened and the nitrogen gas is introduced in the reaction vessel. Thereby, the nitrogen pressure was set to 3.3 MPa by using the pressure control unit 16. By setting the pressure to this pressure of 3.3 MPa, the total pressure inside the reaction vessel 11 becomes 4 MPa when the temperature of the apparatus of FIG. 12 is increased from the room temperature and reached the crystallization temperature of 775° C.

Next the valve 15 is closed.

Next, the valve 18 is opened and the Ar gas is introduced into the reaction vessel 11. In this operation, the pressure of the Ar gas is set to 6.6 MPa by the pressure control unit 19. In other words, the Ar partial pressure in the reaction vessel 11 becomes 3.3 MPa. It should be noted that this pressure (6.6 MPa) is the pressure that realizes the total pressure of 8 MPa in the apparatus of FIG. 14 when the temperature has reached the crystallization temperature of 775° C. and both of nitrogen and Ar has the partial pressure of 4 MPa.

Next, the valves 18 and 21 are closed and the reaction vessel 11 is tightly sealed.

Next, the heater 13 is energized with electric current and the temperature of the melt mixture 25 is increased to the crystal growth temperature set to 775° C. from the room temperature (27° C.). Thereby, the temperature increase rate becomes 748° C./hour.

The pressure of inside the sealed reaction vessel 11 is increased with increase of temperature and the total pressure in the reaction vessel 11 becomes 8 MPa at the time the temperature has reached the crystal growth temperature of 775° C. In this state, both nitrogen and Ar has the partial pressure of 4 MPa, and the pressure increase rate becomes 0.7 MPa/hour.

After holding this state for 300 hours, the temperature is lowered to the room temperature and the reaction vessel 11 is opened. It was confirmed that there is no formation of the polycrystalline aggregate in the crucible 12 covering the melt surface. Further, it was observed that a colorless transparent GaN single crystal 30 of columnar form was grown at the bottom of the crucible having a length of about 5 mm in the direction of the c axis.

As a result of the scanning microscopic observation made for c surface of the columnar GaN crystal thus grown, it was observed that the crystal having a length of 1 mm or more is formed. Further, the dislocation density obtained by observation of the transmission electron microscope was $10^6$ cm$^{-2}$ or less.

Example 14

In Example 14, a columnar GaN single crystal is grown on a seed crystal, by introducing a substance containing nitrogen together with an inert gas with an amount determined such that the partial pressure of the substance and the partial pressure of the inert gas become predetermined pressure values in the reaction vessel at the predetermined crystal growth temperature. Thereafter, the reaction vessel is sealed and the temperature is increased to the predetermined crystal growth temperature.

In Example 16, a gallium nitride (GaN) crystal is by using gallium (Ga) for the group III element, sodium (Na) for the alkali metal, nitrogen gas ($N_2$) for the substance containing nitrogen and Ar for the gas suppressing the evaporation of Na.

Figure 15:
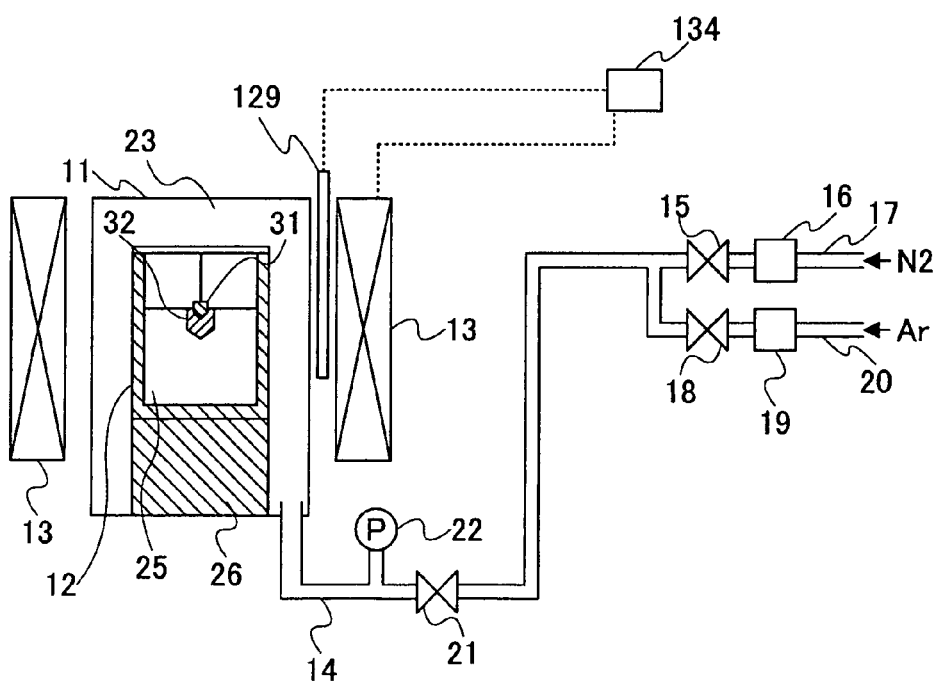
FIG. 15 is a diagram (cross-sectional view) showing an example of the crystal growth apparatus used in Example 14 of the present invention.

FIG. 15 is a diagram (cross-sectional view) showing an example of the crystal growth apparatus used in Example 14. In the crystal growth apparatus of FIG. 15, the Ar gas supply line 20 is added to the apparatus of FIG. 12. Further, there is added a mechanism for holding a seed crystal at the top part of the crucible 12.

Next, the growth method of GaN that uses the crystal growth apparatus of FIG. 15 will be explained.

First, the reaction vessel 11 is separated from the crystal growth apparatus at the part of the valve 21 and is accommodated into a glove box of Ar atmosphere.

Next, Ga is introduced into the crucible 12 made of BN as the group III element source material, and sodium (Na) is further added as the alkali metal. The ratio of Na and Ga is set to 0.51 in terms of the ratio Na/(Na+Ga).

Next, a seed crystal 31 is suspended from the upward of the crucible 12 such that a part of the seed crystal 31 makes a contact with the melt mixture 25.

Next, the crucible 12 is introduced into the reaction vessel 11. Further, the reaction vessel 11 is sealed and the valve 21 is closed such that the interior of the reaction vessel 11 is disconnected from the outside atmosphere. Next, the reaction vessel 11 is taken out from the glove box and assembled into the crystal growth apparatus. Thus, the reaction vessel 11 is provided to a specified position where the heater 13 is provided and is connected to the gas supply line 14 of the nitrogen and argon at the part of the valve 21.

Next, the valves 15 and 21 are opened and the nitrogen gas is introduced in the reaction vessel. Thereby, the nitrogen pressure was set to 3.3 MPa by using the pressure control unit 16. By setting the pressure to this pressure of 3.3 MPa, the total pressure inside the reaction vessel 11 becomes 4 MPa when the temperature of the apparatus of FIG. 12 is increased from the room temperature and reached the crystallization temperature of 775° C.

Next the valve 15 is closed.

Next, the valve 18 is opened and the Ar gas is introduced into the reaction vessel 11. In this operation, the pressure of the Ar gas is set to 6.6 MPa by the pressure control unit 19. In other words, the Ar partial pressure in the reaction vessel 11 becomes 3.3 MPa. It should be noted that this pressure (6.6 MPa) is the pressure that realizes the total pressure of 8 MPa in the apparatus of FIG. 14 when the temperature has reached the crystallization temperature of 775° C. and both of nitrogen and Ar has the partial pressure of 4 MPa.

Next, the valves 18 and 21 are closed and the reaction vessel 11 is tightly sealed.

Next, the heater 13 is energized with electric current and the temperature of the melt mixture 25 is increased to the crystal growth temperature set to 775° C. from the room temperature (27° C.). Thereby, the temperature increase rate becomes 748° C./hour.

The pressure of inside the sealed reaction vessel 11 is increased with increase of temperature and the total pressure in the reaction vessel 11 becomes 8 MPa at the time the temperature has reached the crystal growth temperature of 775° C. In this state, both nitrogen and Ar has the partial pressure of 4 MPa, and the pressure increase rate becomes 0.7 MPa/hour.

After holding this state for 300 hours, the temperature is lowered to the room temperature and the reaction vessel 11 is opened. It was confirmed that there is no formation of the polycrystalline aggregate in the crucible 12 covering the melt surface. Further, it was observed that there is caused a growth in the seed crystal and a colorless transparent GaN single crystal 32 of columnar form was grown with a length of about 8 mm in the direction of the c axis.

Twenty-Second Embodiment

Figure 16:
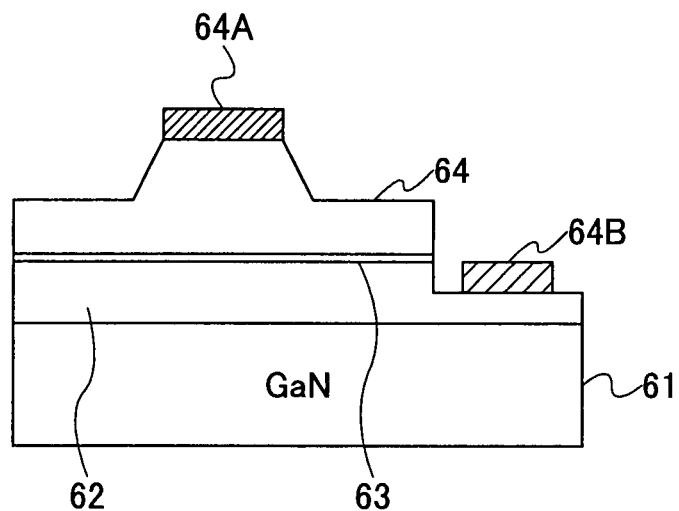
FIG. 16 is a diagram showing an example of the laser diode according to an embodiment of the present invention.

FIG. 16 is a diagram showing an example of a blue to ultraviolet laser diode constructed on a bulk GaN single crystal substrate formed according to the present invention.

Referring to FIG. 16, the laser diode is constructed on an insulating GaN bulk crystal substrate 61 and includes a lower cladding layer 62 of n-type AlGaN doped with Si and formed epitaxially on the GaN bulk crystal substrate 62, wherein an active layer 63 of undoped InGaN is formed epitaxially on the lower cladding layer 62.

Further, an upper cladding layer 64 of AlGaN doped with Mg formed epitaxially on the active layer 63, wherein the upper cladding layer 64 is formed with a ridge waveguide structure extending in the axial direction of the laser diode. Further, a p-side electrode 64A is formed on the ridge waveguide structure and an n-side electrode 61A is formed on the lower cladding layer 62.

In the laser diode of FIG. 16, it should be noted that the GaN bulk crystal substrate 61 has a thickness of 80-100 μm, which exceeds the conventional maximum thickness of 20 μm. By using such a thick substrate, it becomes possible to form the laser diode with reliability, without cracking the thin substrate. Because of the very small dislocation density in the GaN bulk crystal substrate 61, the laser diode of FIG. 16 can oscillate at the blue wavelength with small laser oscillation threshold.

It should be noted that the laser diode of FIG. 16 may be the one that uses Fabri-Perot resonator or a DFB laser diode that uses a diffraction grading. In the case of a Fabri-Perot laser diode, the present invention can easily form high-performance optical cavity by conducting the cleaving process. Further, the active layer 63 may have an MQW structure.

Further, the laser diode of FIG. 16 may be a SCH type laser diode having a pair of optical waveguide layers adjacent to the active layer 63.

Twenty-Third Embodiment

Figure 17:
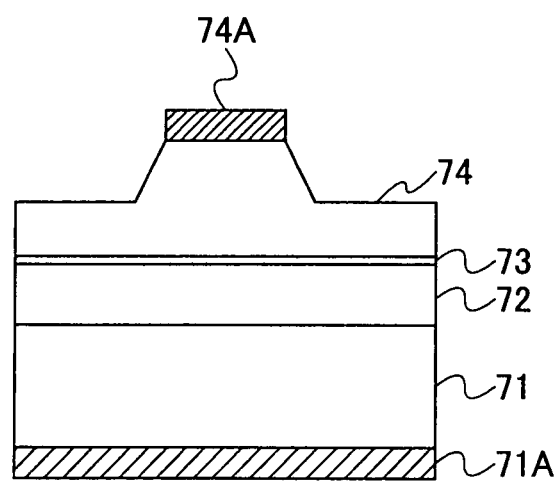
FIG. 17 is a diagram showing another example of the laser diode according to an embodiment of the present invention.

FIG. 17 shows another example of the blue to ultraviolet laser diode constructed on an n-type single crystal bulk substrate of GaN formed according to the crystal growth process of the present invention.

Referring to FIG. 17, the laser diode is constructed on a GaN bulk crystal substrate 71 of n-type, and includes a lower cladding layer 73 of n-type AlGaN doped with Si and formed epitaxially on the GaN substrate 71, wherein an active layer of undoped InGaN is formed epitaxially on the lower cladding layer 73.

On the active layer 73, an upper cladding layer 74 of AlGaN doped with Mg to p-type is formed epitaxially, wherein the upper cladding layer 74 is formed with a ridge waveguide structure extending in the axial direction of the laser diode, and a p-side electrode 74A is formed on the top of the ridge waveguide structure.

Because the GaN substrate 71 has the n-type, the laser diode has an n-side electrode 71A at the bottom surface of the GaN substrate 71.

Similarly as before, the laser diode may be a Fabri-Perot laser diode or a DFB laser diode. Further, the active layer may have a MQW structure. Further, the laser diode may have the SCH structure.

By using the laser diode of FIG. 16 or FIG. 17, various electronic apparatuses can be formed including laser printer, CD player, DVD player, and the like.

Further, by using the GaN single crystal substrate of the present invention, it is possible to construct a LED similarly to the laser diode of FIG. 16 or FIG. 17.

Further, the present invention is not limited to the embodiments described heretofore, but various variations and modifications may be made without departing from the scope of the invention.

The present invention is based on the Japanese priority applications 2002-325131 and 2002-342748 filed respectively on Nov. 8, 2002 and Nov. 26, 2002, the entire contents of which are incorporated herein as reference.

What is claimed is:

1. A crystal growth apparatus for crystallizing a group III nitride formed of a group III element and nitrogen from a melt mixture of an alkali metal and a substance containing a group III element and a substance containing nitrogen, comprising:
 a reaction vessel holding therein said melt mixture; and
 a structure for supplying a heated gas into said reaction vessel,
 said structure comprising:
 a gas supply line supplying at least a nitrogen gas to said reaction vessel;
 a heating container provided on said gas supply line, said heating container being configured to preheat said nitrogen gas supplied through said gas supply line to said reaction vessel; and
 a valve provided on said gas supply line between said heating container and said reaction vessel.

* * * * *